United States Patent
Kawajiri et al.

(10) Patent No.: US 10,989,775 B2
(45) Date of Patent: Apr. 27, 2021

(54) MAGNETIC RESONANCE IMAGING APPARATUS FOR SUPPLYING POWER TO GRADIENT COILS

(71) Applicant: Canon Medical Systems Corporation, Otawara (JP)

(72) Inventors: Sho Kawajiri, Nasushiobara (JP); Motohiro Miura, Yaita (JP); Masashi Hori, Nasushiobara (JP)

(73) Assignee: Canon Medical Systems Corporation, Otawara (JP)

( * ) Notice: Subject to any disclaimer, the term of this patent is extended or adjusted under 35 U.S.C. 154(b) by 108 days.

(21) Appl. No.: 16/183,055

(22) Filed: Nov. 7, 2018

(65) Prior Publication Data

US 2019/0137581 A1    May 9, 2019

(30) Foreign Application Priority Data

Nov. 8, 2017 (JP) .............................. JP2017-215932
Nov. 8, 2017 (JP) .............................. JP2017-215974
Nov. 5, 2018 (JP) .............................. JP2018-208347

(51) Int. Cl.
*G01R 33/385*  (2006.01)
*G01R 33/36*   (2006.01)
(Continued)

(52) U.S. Cl.
CPC ..... *G01R 33/3852* (2013.01); *G01R 33/3621* (2013.01); *G01R 33/4822* (2013.01); *G01R 33/543* (2013.01)

(58) Field of Classification Search
CPC .............. G01R 33/3852; G01R 33/385; G01R 33/3806; G01R 33/383; G01R 33/445; G01R 33/3854; G01R 33/3657; G01R 33/34092; G01R 33/4215; G01R 33/3642; G01R 33/389; G01R 33/48; G01R 33/5608; G01R 33/3614; G01R 33/543; G01R 33/5659; G01R 33/46; G01R 33/36; G01R 33/3804; G01R 33/54; G01R 33/546; G01R 33/583; G01R 33/60; G01R 35/00;
(Continued)

(56) References Cited

U.S. PATENT DOCUMENTS 6,975,116 B2 * 12/2005 McKinnon ........... G01R 33/385
                                                          324/318
9,594,132 B2 *  3/2017 Van Helvoort .. G01R 33/34023
(Continued)

FOREIGN PATENT DOCUMENTS

| JP | 2013-173   | 1/2013 |
| JP | 2017-35305 | 2/2017 |
| JP | 2017-99786 | 6/2017 |

*Primary Examiner* — Vinh P Nguyen
(74) *Attorney, Agent, or Firm* — Oblon, McClelland, Maier & Neustadt, L.L.P.

(57) ABSTRACT

According to one embodiment, a magnetic resonance imaging apparatus includes amplifiers, processing circuitry, and a power supplier. The amplifiers supplies power for each of a plurality of channels of gradient coils. The processing circuitry obtains, for each of the channels, a voltage gradient that represents a temporal change of a power supply voltage for supplying a current to the amplifiers. The power supplier supplies the power to an amplifier corresponding to a specific one of the channels on a priority basis in accordance with the voltage gradient.

7 Claims, 14 Drawing Sheets

(51) Int. Cl.
G01R 33/48 (2006.01)
*G01R 33/54* (2006.01)

(58) Field of Classification Search
CPC .............. G01R 33/34; G01R 33/34023; G01R 33/341; G01R 33/3415; G01R 33/3664; G01R 33/3621; G01R 33/3815; G01R 33/4822; A61B 90/00; A61B 5/055; A61B 5/0035; A61B 6/4417; A61G 13/104; H03F 3/45475; H03F 2200/261; H03F 2200/301; H03F 2200/351; H03F 3/2178; H03F 1/565; H03F 2200/129; H03F 2200/312; H03F 2200/462; H03F 3/211; H03F 1/0277; H03F 2203/21106; H03F 3/72; G05F 1/461; H02M 3/33569; H02M 3/33576; H02M 7/493; H02M 7/483; H02M 7/49; H02M 1/10; H02M 2001/0009; A61N 2/02; G05B 17/02; G06F 11/3055

See application file for complete search history.

(56) References Cited

U.S. PATENT DOCUMENTS

| | | | |
|---|---|---|---|
| 10,310,038 B2 * | 6/2019 | Wiza | G01R 33/3852 |
| 10,416,255 B2 * | 9/2019 | Kawajiri | G01R 33/3856 |
| 2017/0045595 A1 | 2/2017 | Machii et al. | |
| 2017/0160358 A1 | 6/2017 | Miura et al. | |
| 2019/0347177 A1 * | 11/2019 | Citirik | G06N 3/08 |

* cited by examiner

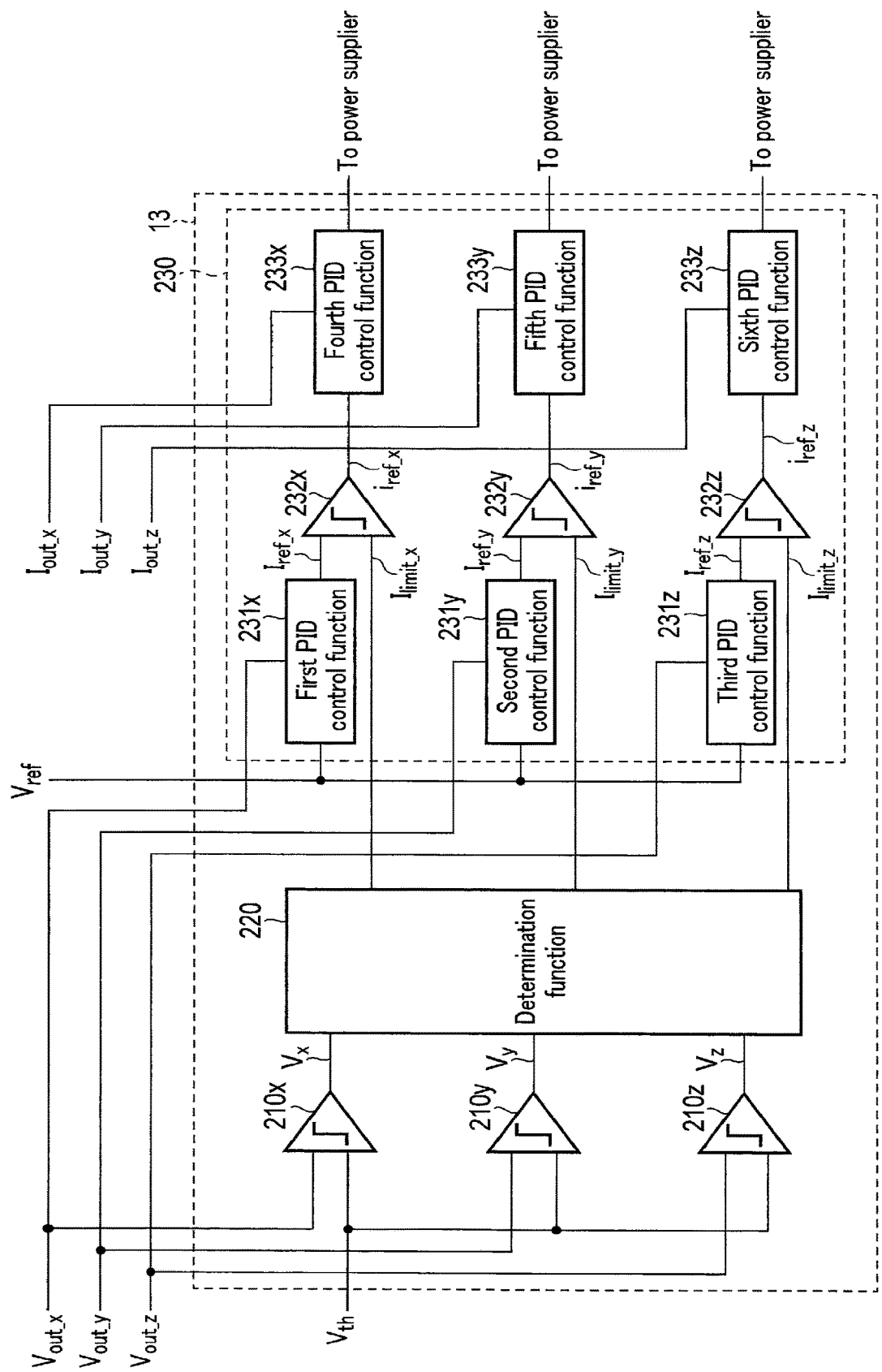
F I G. 4

| | $V_x$ | $V_y$ | $V_z$ | $I_{limit\_x}$ | $I_{limit\_y}$ | $I_{limit\_z}$ | |
|---|---|---|---|---|---|---|---|
| 601 -- | 1 | 1 | 1 | 33 | 33 | 33 | -- 602 |
| 603 -- | 1 | 1 | 0 | 4 | 4 | 92 | -- 604 |
| 605 -- | 1 | 0 | 1 | 4 | 92 | 4 | -- 606 |
| 607 -- | 1 | 0 | 0 | 4 | 48 | 48 | -- 608 |
| | ⋮ | ⋮ | ⋮ | ⋮ | ⋮ | ⋮ | |
| 609 -- | 0 | 0 | 0 | 33 | 33 | 33 | -- 610 |

F I G. 6

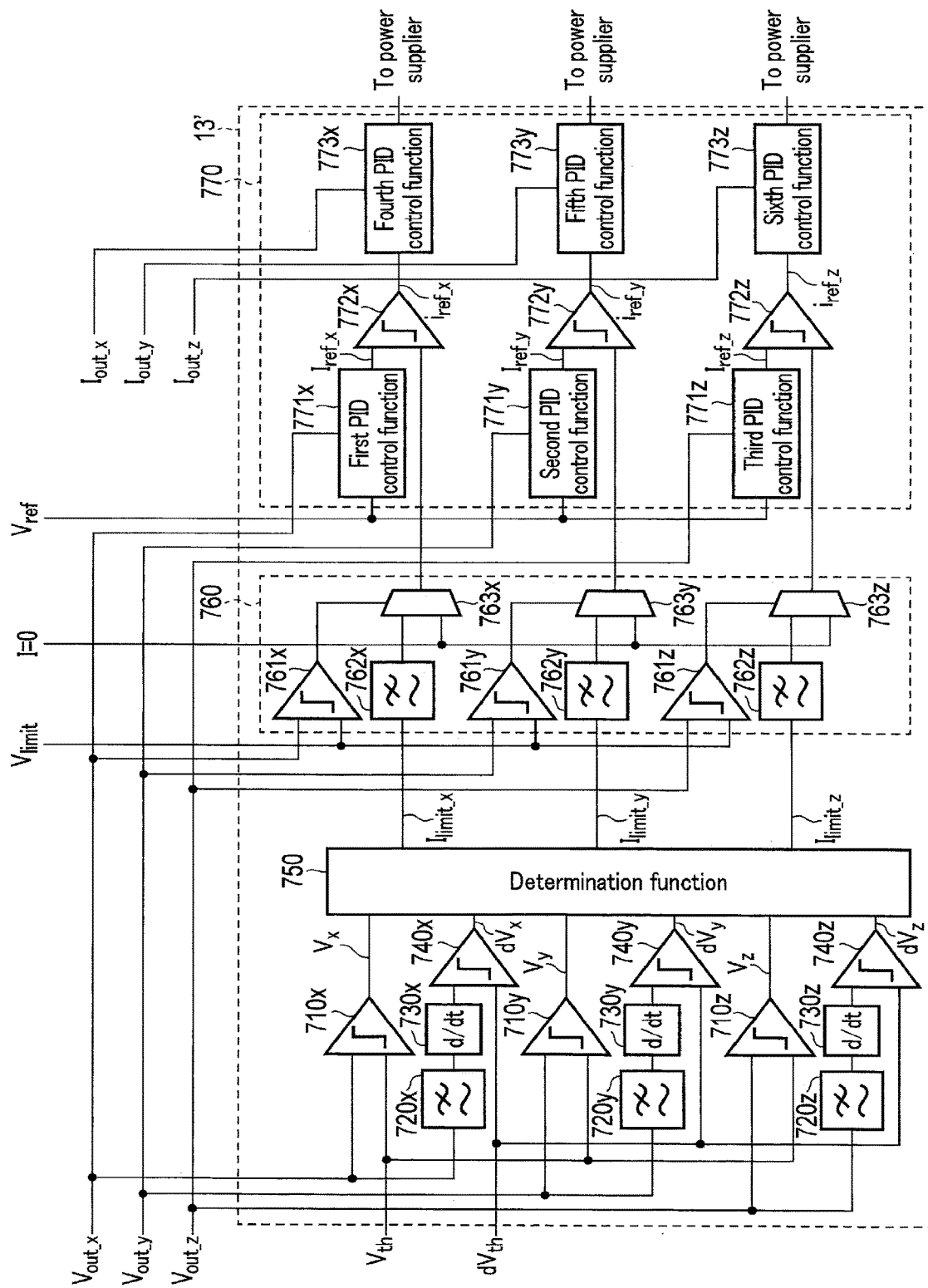
F I G. 7

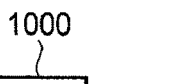
F I G. 10

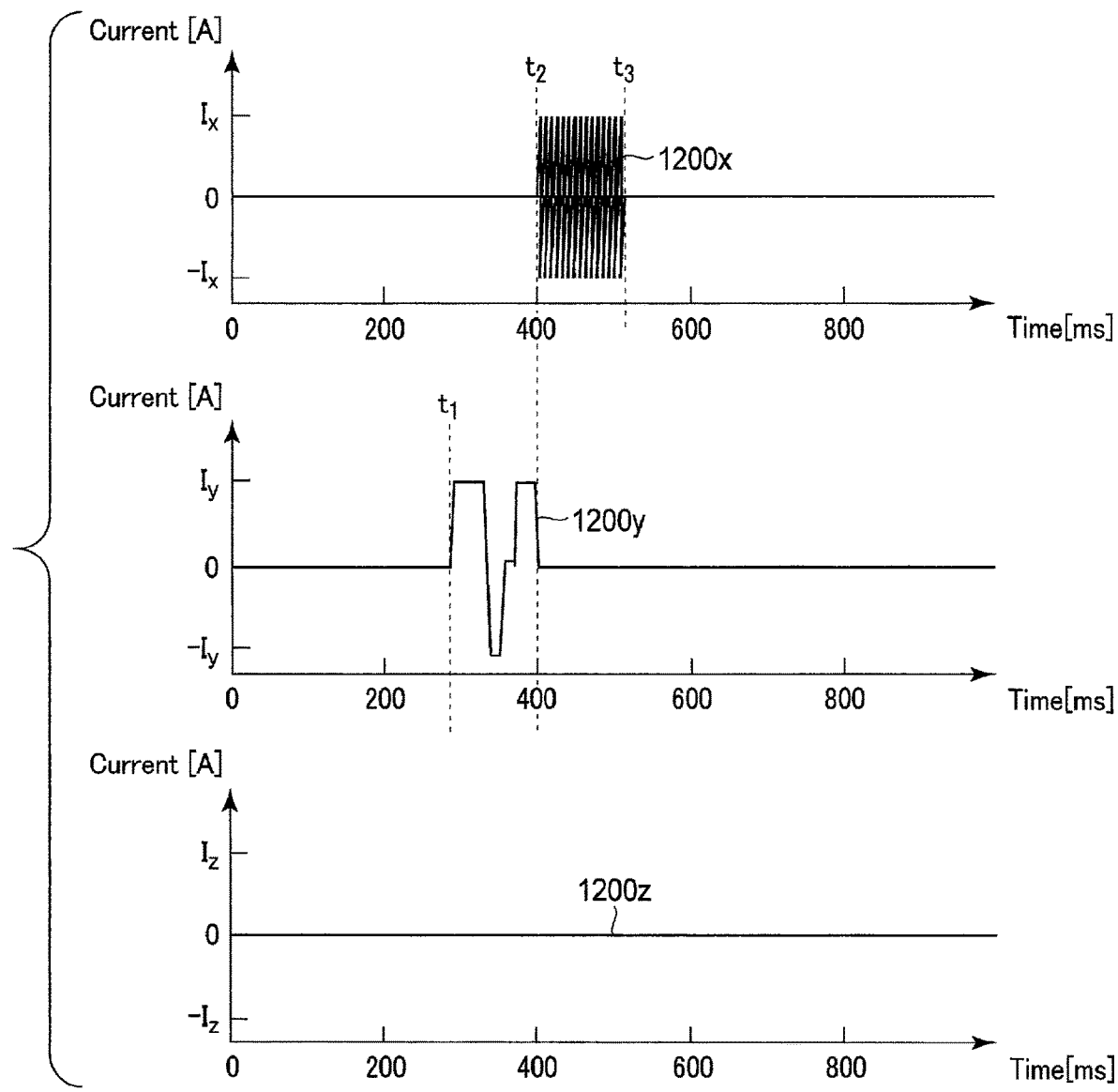
F I G. 12

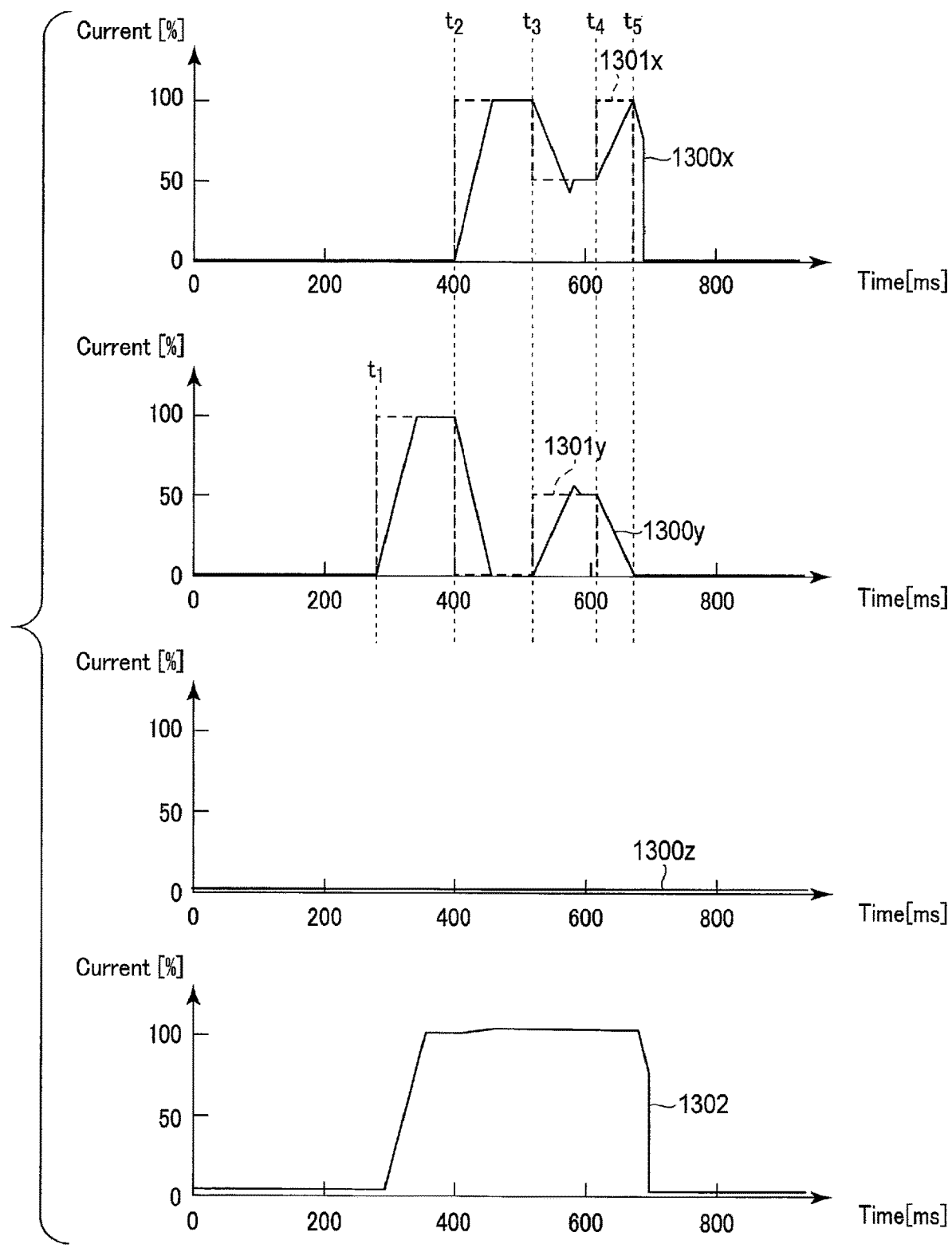
F I G. 13

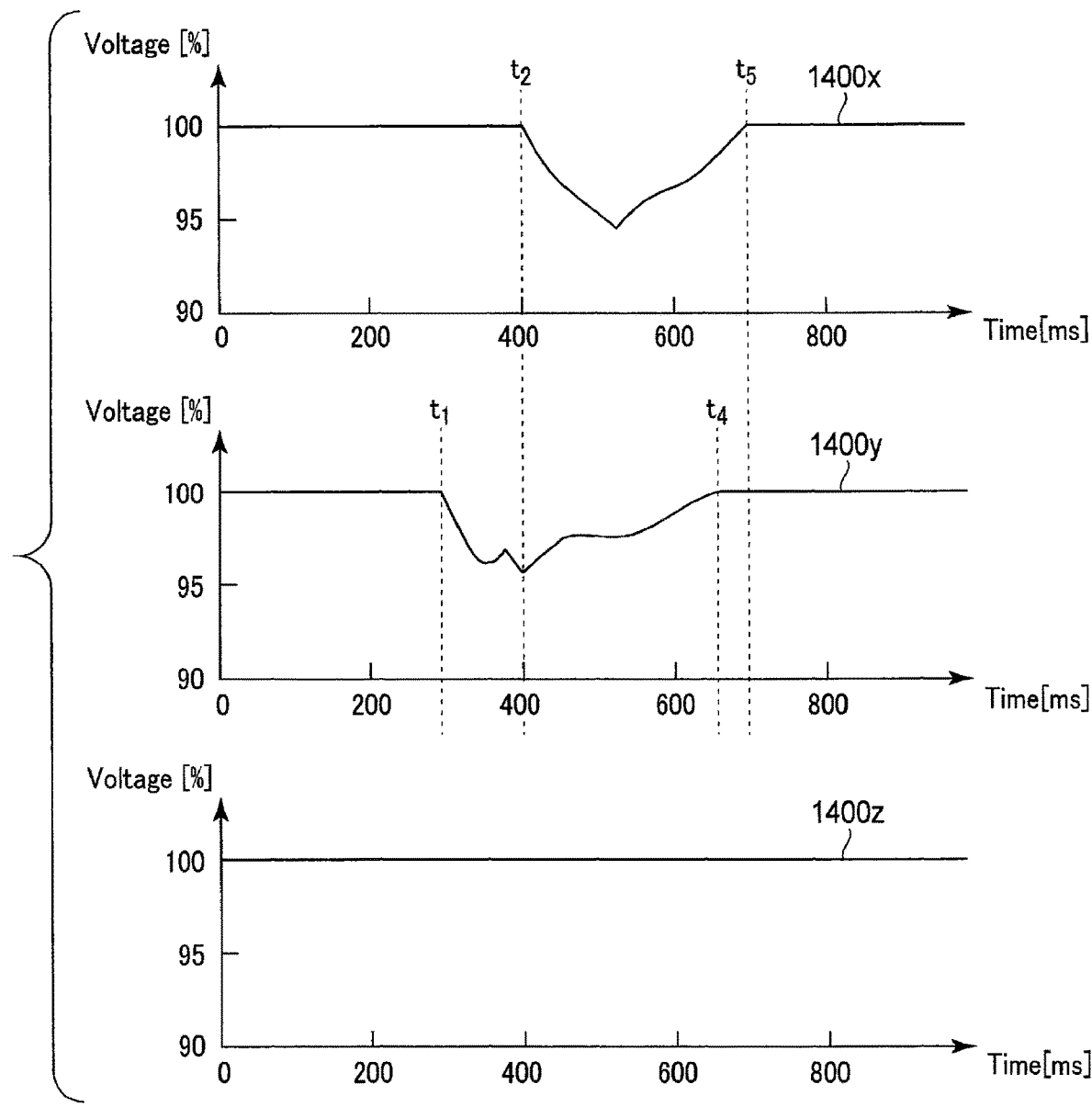
F I G. 14

MAGNETIC RESONANCE IMAGING APPARATUS FOR SUPPLYING POWER TO GRADIENT COILS

CROSS-REFERENCE TO RELATED APPLICATIONS

This application is based upon and claims the benefit of priority from Japanese Patent Applications No. 2017-215932, filed Nov. 8, 2017; No. 2017-215974, filed Nov. 8, 2017; and No. 2018-208347, filed Nov. 5, 2018; the entire contents of all of which are incorporated herein by reference.

FIELD

Embodiments of the present invention relate to a magnetic resonance imaging apparatus and a method for supplying power.

BACKGROUND

A gradient magnetic field power supply provided in a magnetic resonance imaging (MRI) apparatus determines the number of outputs from a power supplier, which serves as a power source of the amplifier, in accordance with the number of output channels for supplying power from an amplifier to gradient coils. A conventional gradient magnetic field power supply employs hardware control for the assignment of the current output from the power supplier.

The gradient magnetic field power supply that performs the hardware control, however, needs to deal with a large number of analog signals as control targets, making the configuration of the gradient magnetic field power supply complicated.

The conventional gradient magnetic field power supply monitors an output voltage from the power supplier, and assigns the output current to the channels in which a drop in the output voltage appears.

In the conventional gradient magnetic field power supply, because the assignment of the output current is based only on the drop of the output voltage, the drop of the output voltage of a certain channel may increase to an extreme. For instance, when a large output is to be made for one channel after outputting to two channels in the conventional gradient magnetic field power supply, a charging current is supplied to channels that are not currently used for outputting. This may result in a larger drop in the output voltage of the channel that is being used for the large output.

BRIEF DESCRIPTION OF THE DRAWINGS

FIG. 4 is a diagram illustrating the software configuration of a power control circuitry according to the first embodiment.

FIG. 6 is a look-up table according to the first embodiment.

FIG. 7 is a diagram illustrating the software configuration of a power control circuitry according to the second embodiment.

FIG. 10 is a diagram of a look-up table according to the second embodiment.

FIG. 12 is a diagram illustrating the waveforms of currents that are output from the amplifiers according to the second embodiment.

FIG. 13 is a diagram illustrating the waveforms of currents that are output from the power supplier and the target waveforms according to the second embodiment.

FIG. 14 is a diagram illustrating the waveforms of voltages that are output from the power supplier according to the second embodiment.

DETAILED DESCRIPTION

According to one embodiment, a magnetic resonance imaging apparatus includes amplifiers, processing circuitry, and a power supplier. The amplifiers supplies power for each of a plurality of channels of gradient coils. The processing circuitry obtains, for each of the channels, a voltage gradient that represents a temporal change of a power supply voltage for supplying a current to the amplifiers. The power supplier supplies the power to an amplifier corresponding to a specific one of the channels on a priority basis in accordance with the voltage gradient.

Embodiments will be described with reference to the drawings.

First Embodiment

Figure 1:
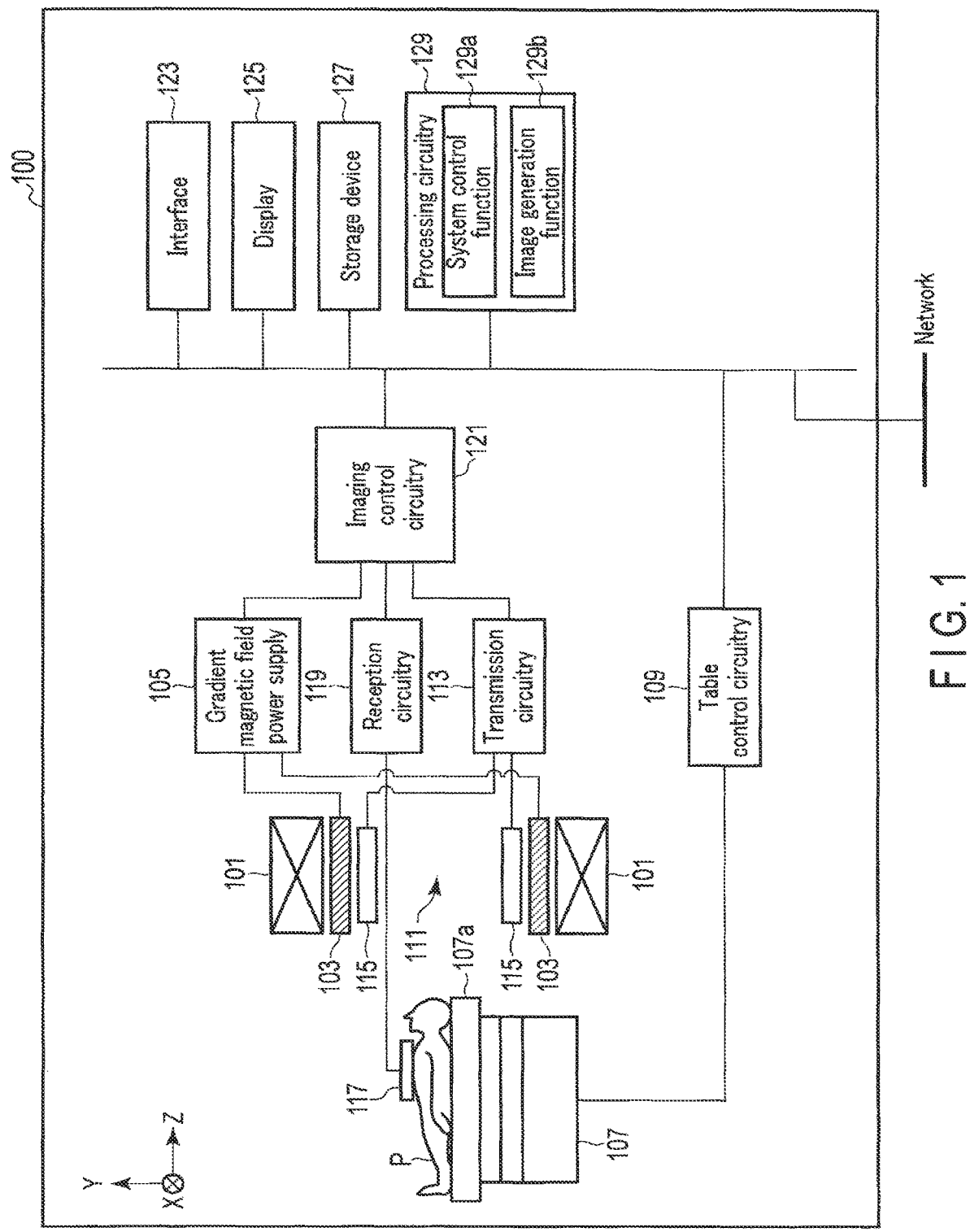
FIG. 1 is a diagram illustrating the configuration of an MRI apparatus according to the first embodiment.

FIG. 1 is a diagram illustrating the configuration of an MRI apparatus according to the first embodiment. As illustrated in FIG. 1, an MRI apparatus 100 according to the first embodiment is provided, for example, with static field magnets 101, gradient coils 103, a gradient magnetic field power supply 105, a table 107, a table control circuitry 109, a transmission circuitry 113, a transmission coil 115, a reception coil 117, a reception circuitry 119, an imaging control circuitry 121, an interface 123, a display 125, a storage device 127, and processing circuitry 129.

A static field magnet 101 is formed into an approximately cylindrical, hollowed shape. The static field magnet 101 generates a static magnetic field uniformly in its inner space. A superconducting magnet may be adopted as the static field magnet 101. The static field magnet 101 may be formed into an open-end type.

A gradient coil 103 is formed into an approximately cylindrical, hollowed shape. Each gradient coil 103 is arranged inside the static field magnet 101. The gradient coil 103 is constituted by combining three coils corresponding to the X, Y, and Z axes that are orthogonal to each other. The Z-axis direction is the same as the direction of the static magnetic field. The Y-axis direction is the vertical direction, and the X-axis direction is a direction perpendicular to the Z and Y axes. The three coils of the gradient coil 103 individually receive the power supplied from the gradient magnetic field power supply 105, and each of the coils generates a gradient magnetic field, the magnetic intensity of which varies along the X, Y, or Z axis. In consideration of the three coils being controlled through different channels, the gradient coil 103 may be referred to as a "gradient coil having a plurality of channels".

The gradient magnetic fields generated in the X, Y, and Z axes by the gradient coil 103 may form a frequency encoding gradient magnetic field (also referred to as a read-out gradient magnetic field), a phase encoding gradient magnetic field, and a slice selection gradient magnetic field. The frequency encoding gradient magnetic field is used for changing the frequency of a magnetic resonance (MR) signal in accordance with the spatial position. The phase encoding gradient magnetic field is used for changing the phase of the MR signal in accordance with the spatial position. The slice selection gradient magnetic field is used for determining an imaging cross unit.

Under the control of the imaging control circuitry 121, the gradient magnetic field power supply 105 serves as a power supply device that supplies a current to the gradient coil 103. The gradient magnetic field power supply 105 will be explained in detail later.

The table 107 is a device that includes a table top 107a on which a subject P lies. Under the control of the table control circuitry 109, the table 107 moves the table top 107a carrying the subject P thereon, into a bore 111. The table 107 may be installed in an examination room in which the MRI apparatus 100 is installed in a manner that the longitudinal direction of the table 107 is positioned parallel to the center axis of the static field magnet 101.

The table control circuitry 109 controls the table 107, and drives the table 107 in accordance with the instructions input by the operator on the interface 123, thereby moving the table top 107a in the longitudinal and vertical directions. The table control circuitry 109 is an example of a means for realizing a table controller.

Under the control of the imaging control circuitry 121, the transmission circuitry 113 supplies a radio frequency (RF) pulse corresponding to a Larmor frequency to the transmission coil 115. The transmission circuitry 113 is an example of a means for realizing a transmitter.

The transmission coil 115 is an RF coil arranged inside the gradient coil 103. Upon supply of the RF pulse from the transmission circuitry 113, the transmission coil 115 generates a transmission RF wave corresponding to a high-frequency magnetic field. The transmission coil may be a whole body coil (WB coil). The WB coil may be used as a transmission/reception coil.

The reception coil 117 is an RF coil arranged inside the gradient coil 103. The reception coil 117 receives an MR signal released from the subject P in the high-frequency magnetic field. The reception coil 117 outputs the received MR signal to the reception circuitry 119. The reception coil 117 may be a coil array including one or more coil elements, or typically including a plurality of coil elements. In FIG. 1, the transmission coil 115 and the reception coil 117 are illustrated as separate RF coils. However, the transmission coil 115 and the reception coil 117 may be realized as an integrated transmission/reception coil. The transmission/reception coil may be provided to correspond to the imaging target area of the subject P. For example, a head coil may be arranged as a local reception/transmission RF coil.

Under the control of the imaging control circuitry 121, the reception circuitry 119 generates a digital MR signal that is the digitized complex data, based on the MR signal output from the reception coil 117. In particular, the reception circuitry 119 implements various signal processes onto the MR signal output from the reception coil 117, and thereafter executes an analog-to-digital (A/D) conversion onto the data subjected to the signal processes. The reception circuitry 119 samples the A/D converted data. In this manner, a digital MR signal (hereinafter referred to as "MR data") is generated. The reception circuitry 119 outputs the generated MR data to the imaging control circuitry 121. The reception circuitry 119 is an example of a means for realizing the receiver.

The imaging control circuitry 121 controls the gradient magnetic field power supply 105, the transmission circuitry 113, and the reception circuitry 119 in accordance with an imaging protocol output from the processing circuitry 129, and performs imaging of the subject P. The imaging protocol includes various pulse sequences corresponding to an examination. The imaging protocol may define, for example, a gradient magnitude field waveform indicating the magnitude of the current supplied from the gradient magnetic field power supply 105 to the gradient coil 103, the timing of supplying the current from the gradient magnetic field power supply 105 to the gradient coil 103, the size of the RF pulse supplied by the transmission circuitry 113 to the transmission coil 115, the timing of supplying the RF pulse from the transmission circuitry 113 to the transmission coil 115, and the timing of receiving the MR signal by the reception coil 117. The imaging control circuitry 121 is an example of a means for realizing an imaging controller.

The interface 123 includes a circuit that receives various commands and information from the operator. The interface 123 may include a circuit that relates to an input device, for example, a pointing device such as a mouse, or an input device such as a keyboard. The circuit included in the interface 123 is not limited to circuits related to physical components for operation, such as a mouse and keyboard. The interface 123 may be, for example, provided with an electric signal processing circuit for receiving electric signals corresponding to an operation that is input from an input device externally arranged separate from the MRI apparatus 100, and outputting the received electric signals to various other circuits.

Under the control of the system control function 129a of the processing circuitry 129, the display 125 displays MR images generated by an image generation function as well as various information relating to the imaging and image processing. The display 125 may be a device such as a CRT display, liquid crystal display, organic EL display, LED display, plasma display, or any other display or monitor known in the field of the technology.

The storage device 127 stores therein the MR data to fill the k-space by using the image generation function 129b, and image data generated by the image generation function 129b. The storage device 127 also stores therein imaging protocols and imaging conditions such as various imaging parameters that define the imaging protocols. The storage device 127 stores programs corresponding to various functions implemented by the processing circuitry 129. The storage device 127 may be, for example, a Random Access Memory (RAM), a semiconductor memory element such as a flash memory, a hard disk drive, a solid state drive, and an optical disk. The storage device 127 may be a drive device that reads and writes various information from and into a portable storage medium such as a CD-ROM drive, DVD drive, and flash memory. The storage device 127 is an example of a means for realizing a storage unit.

The processing circuitry 129 includes, as hardware resources, a not-shown processor and memories such as a Read-Only Memory (ROM) and RAM, and controls the MRI apparatus 100. The processing circuitry 129 is provided with the system control function 129a and the image generation function 129b. The various functions, which are performed by the system control function 129a and the image generation function 129b, are stored in the storage device 127 in the form of a computer-executable program. The processing circuitry 129 is a processor that reads from the storage device 127 a program corresponding to each function, and executes the program so that the function corresponding to this program can be realized. In other words, the processing circuitry 129 that has read the programs may be provided with the functions of the processing circuitry 129 indicated in FIG. 1. The processing circuitry 129 is an example of a means for realizing a processor.

The structure of FIG. 1 has been explained as a single processing circuitry 129 realizing the functions. However, a plurality of independent processors may be combined to form a processing circuitry 129 so that the functions can be realized by each processor implementing the respective programs. That is, the aforementioned functions may be prepared as programs so that the programs can be implemented by one processing circuitry, or a specific function can be implemented by a dedicated and independent program implementing circuit.

The above "processor" may denote any circuit such as a CPU (Central Processing Unit), a GPU (Graphics Processing Unit), an Application Specific Integrated Circuit (ASIC), or a Programmable Logic Device (e.g., a Simple Programmable Logic Device (SPLD), a Complex Programmable Logic Device (CPLD), and a Field Programmable Gate Array (FPGA)).

The processor realizes the functions by reading and implementing the programs stored in the storage device 127. Instead of storing the programs in the storage device 127, the programs may be directly incorporated into the circuit of the processor. If this is the case, the processor realizes the functions by reading and implementing the programs incorporated in the processor. Similarly, the table control circuitry 109, the transmission circuitry 113, the reception circuitry 119, and the imaging control circuitry 121 are also constituted by the above processor, or by an electronic circuit.

The processing circuitry 129 controls the MRI apparatus 100 with the system control function 129a. Specifically, the processing circuitry 129 reads a system control program stored in the storage device 127, expands it on the memory, and controls the circuits of the MRI apparatus 100 in accordance with the expanded system control program. The processing circuitry 129 may read an imaging protocol from the storage device 127 using the system control function 129a, based on the imaging conditions that the operator inputs on the interface 123. The processing circuitry 129 may generate an imaging protocol based on the imaging conditions. The processing circuitry 129 transmits the imaging protocol to the imaging control circuitry 121, and controls the imaging of the subject P. The processing circuitry 129 that implements the system control function 129a is an example of a means for realizing a system controller.

With the image generation function 129b, the processing circuitry 129 loads the MR data along the k-space read-out direction, in accordance with the intensity of the read-out gradient magnetic field. The processing circuitry 129 performs a Fourier transform on the MR data loaded in the k-space, so as to generate an MR image. The processing circuitry 129 outputs the MR image to the display 125 and the storage device 127. The processing circuitry 129 that implements the image generation function 129b is an example of a means for realizing an image generator.

The overall structure of the MRI apparatus 100 according to the first embodiment has been explained. Next, the structure of the gradient magnetic field power supply 105 will be explained in detail with reference to FIG. 2.

Figure 2:
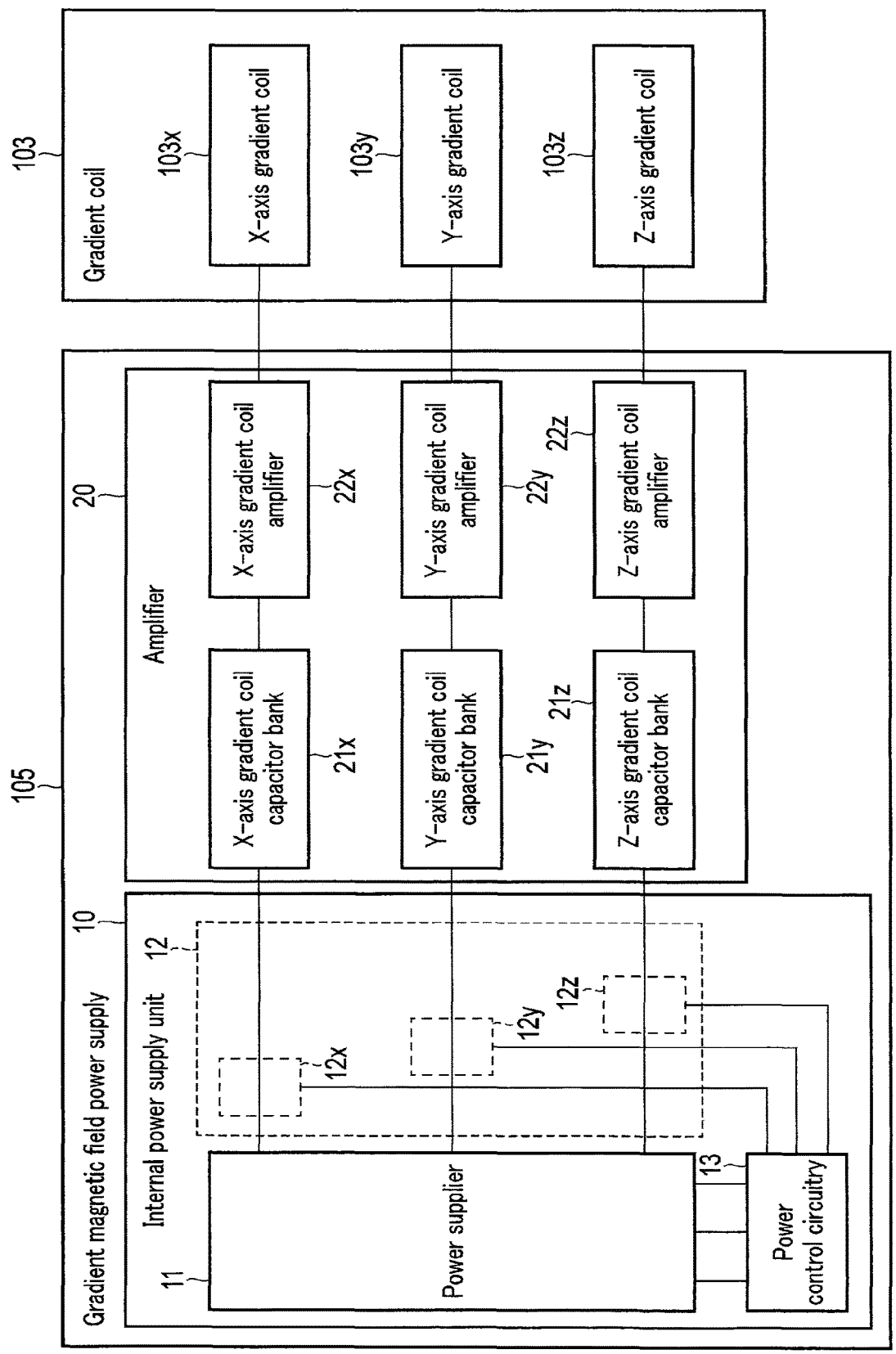
FIG. 2 is a diagram illustrating the configuration of a gradient magnetic field power supply according to the first embodiment.

FIG. 2 is a diagram illustrating the configuration of a gradient magnetic field power supply according to the first embodiment. The gradient magnetic field power supply 105 according to the first embodiment may be provided with an internal power supply unit 10 and an amplifier 20, as illustrated in FIG. 2. The internal power supply unit 10 is provided with a power supplier 11, a measurement device 12, and a power control circuitry 13. The amplifier 20 is provided with an X-axis gradient coil capacitor bank (hereinafter referred to as X-axis capacitor bank) 21x, a Y-axis gradient coil capacitor bank (hereinafter referred to as Y-axis capacitor bank) 21y, a Z-axis gradient coil capacitor bank (hereinafter referred to as Z-axis capacitor bank) 21z, an X-axis gradient coil amplifier (hereinafter referred to as X-axis amplifier) 22x, a Y-axis gradient coil amplifier (hereinafter referred to as Y-axis amplifier) 22y, and a Z-axis gradient coil amplifier (hereinafter referred to as Z-axis amplifier) 22z.

The power supplier 11 is a device that serves as a power source for supplying energy to the X-axis amplifier 22x, the Y-axis amplifier 22y, and the Z-axis amplifier 22z. Under the control of the power control circuitry 13, the power supplier 11 supplies a first current, a second current, and a third current respectively to the X-axis amplifier 22x, Y-axis amplifier 22y, and Z-axis amplifier 22z. The power supplier 11 may be constituted by an AC/DC converter, full-bridge circuits, and a pulse width modulation (PWM) control circuit (not-shown). The AC/DC converter rectifies the alternative current that is output from an alternating current power source. The full-bridge circuits supply power to the X-axis amplifier 22x, the Y-axis amplifier 22y, and the Z-axis amplifier 22z. The PWM control circuit uses, as a drive signal, the correction amount received from the power control circuitry 13 to control a plurality of switching elements in each of the full-bridge circuits. The power supplier 11 may be referred to as a "power supply unit".

The power supplier 11 may be a direct current power source having CV/CC (constant voltage/constant current) characteristics. The power supplier 11 that is the direct current power source having CV/CC characteristics serves as a constant current source if the downstream load is large, and serves as a constant voltage source if the downstream load is small. In the following explanation of the embodiment, which incorporates a large downstream load, the power supplier 11 serves as a constant current source.

The measurement device 12 measures the current supplied to each of the X-axis amplifier 22x, the Y-axis amplifier 22y, and the Z-axis amplifier 22z, and the voltage corresponding to the respective currents. The measurement device 12 further measures a first voltage corresponding to the first current supplied to the X-axis amplifier 22x, a second voltage corresponding to the second current supplied to the Y-axis amplifier 22y, and a third voltage corresponding to the third current supplied to the Z-axis amplifier 22z.

Specifically, the measurement device 12 includes an X-axis measurement device 12x, a Y-axis measurement device 12y, and a Z-axis measurement device 12z. The X-axis measurement device 12x measures the first current supplied to the X-axis amplifier 22x and the first voltage corresponding to the first current. The Y-axis measurement device 12y measures the second current supplied to the Y-axis amplifier 22y and the second voltage corresponding to the second current. The Z-axis measurement device 12z measures the third current supplied to the Z-axis amplifier 22z and the third voltage corresponding to the third current. The X-axis measurement device 12x, the Y-axis measurement device 12y, and the Z-axis measurement device 12z are configured to output the respective measured current and voltage values to the power control circuitry 13.

The power control circuitry 13 includes, as hardware resources, a processor and memories such as a ROM and RAM (not shown), and controls the power supplier 11. The power control circuitry 13 receives the measured current and voltage values from the X-axis measurement device 12x, the Y-axis measurement device 12y, and the Z-axis measurement device 12z. The power control circuitry 13 has a function of controlling the ratio of the amounts of current (hereinafter referred to as a current ratio) output from the power supplier 11 to the X-axis amplifier 22x, the Y-axis amplifier 22y, and the Z-axis amplifier 22z, using the received current and voltage values (hereinafter referred to as a current ratio control function). The current ratio denotes a ratio of the target voltage to the total amount of current supplied by the power supplier 11 (hereinafter referred to as the total current amount). In other words, with the current ratio control function, the power control circuitry 13 controls the first current, the second current, and the third current that are to be supplied respectively to the X-axis amplifier 22x, the Y-axis amplifier 22y, and the Z-axis amplifier 22z, using the first voltage, the second voltage, and the third voltage measured by the measurement device 12. The power control circuitry 13, which receives various data, may be referred to as an acquisition unit.

The current ratio control function is stored in the memory (or the storage device 127) in the form of a computer-executable program. The power control circuitry 13 is a processor that reads from the memory a program corresponding to the current ratio control function, thereby realizing the current ratio control function. The power control circuitry 13 is an example of a means for realizing a power controller.

To provide an overview, the power control circuitry 13 compares a measured voltage with a threshold voltage, and thereby determines whether or not the charging of the X-axis capacitor bank 21x, the Y-axis capacitor bank 21y, and the Z-axis capacitor bank 21z is completed. The power control circuitry 13 determines the current ratio corresponding to the combination of the results of this determination. Using feedback control, such as the proportional integral (PI) control or proportional integral differential (PID) control, of the current amount corresponding to the current ratio, the power control circuitry 13 determines the amount of correction to control the full-bridge circuits in the power supplier 11. The power control circuitry 13 controls the power supplier 11 based on the determined amount of correction.

When the X-axis amplifier 22x is given a higher priority to supply the current, the power control circuitry 13 supplies the current ratio of 92% to the X-axis amplifier 22x, and supplies the current ratio of 4% to each of the Y-axis amplifier 22y and the Z-axis amplifier 22z. The current that is to be supplied to the Y-axis amplifier 22y and the Z-axis amplifier 22z (e.g. the current ratio of 4% each) is to operate the amplifiers (hereinafter referred to as idling current), and this current amount should be suitably determined in accordance with the performance of the amplifiers.

The X-axis capacitor bank 21x, the Y-axis capacitor bank 21y, and the Z-axis capacitor bank 21z are coupled and arranged between the power supplier 11 and the respective ones of the X-axis amplifier 22x, the Y-axis amplifier 22y, and the Z-axis amplifier 22z. The X-axis capacitor bank 21x, the Y-axis capacitor bank 21y, and the Z-axis capacitor bank 21z supply power, together with the power supplier 11, to the X-axis amplifier 22x, the Y-axis amplifier 22y, and the Z-axis amplifier 22z. That is, the X-axis capacitor bank 21x, the Y-axis capacitor bank 21y, and the Z-axis capacitor bank 21z are capacitors that serve as a battery to supply power when the supply from the power supplier 11 is insufficient. Specifically, the X-axis capacitor bank 21x, the Y-axis capacitor bank 21y, and the Z-axis capacitor bank 21z temporarily store the power from the power supplier 11, and output the stored power to the X-axis amplifier 22x, the Y-axis amplifier 22y, and the Z-axis amplifier 22z when needed.

The roles of the X-axis capacitor bank 21x, the Y-axis capacitor bank 21y, and the Z-axis capacitor bank 21z are described below. For example, when a large current needs to be sent for a short length of time to the X-axis gradient coil 103x, the Y-axis gradient coil 103y, and the Z-axis gradient coil 103z, the required amount of power supply may temporarily exceed the supply capacity of the power supplier 11. Even in such a situation, because of the power stored in the X-axis capacitor bank 21x, the Y-axis capacitor bank 21y, and the Z-axis capacitor bank 21z, the gradient magnetic field power supply 105 maintains a stable supply of the power to the X-axis gradient coil 103x, the Y-axis gradient coil 103y, and the Z-axis gradient coil 103z.

The X-axis amplifier 22x, the Y-axis amplifier 22y, and the Z-axis amplifier 22z amplify the gradient magnetic field waveform into a high current pulse. The X-axis amplifier 22x, the Y-axis amplifier 22y, and the Z-axis amplifier 22z output the amplified high current pulse to the gradient coil 103.

As discussed above, the gradient magnetic field power supply 105 supplies the current required for the imaging to the gradient coil 103. The gradient magnetic field power supply 105 will be explained in detail below.

Figure 3:
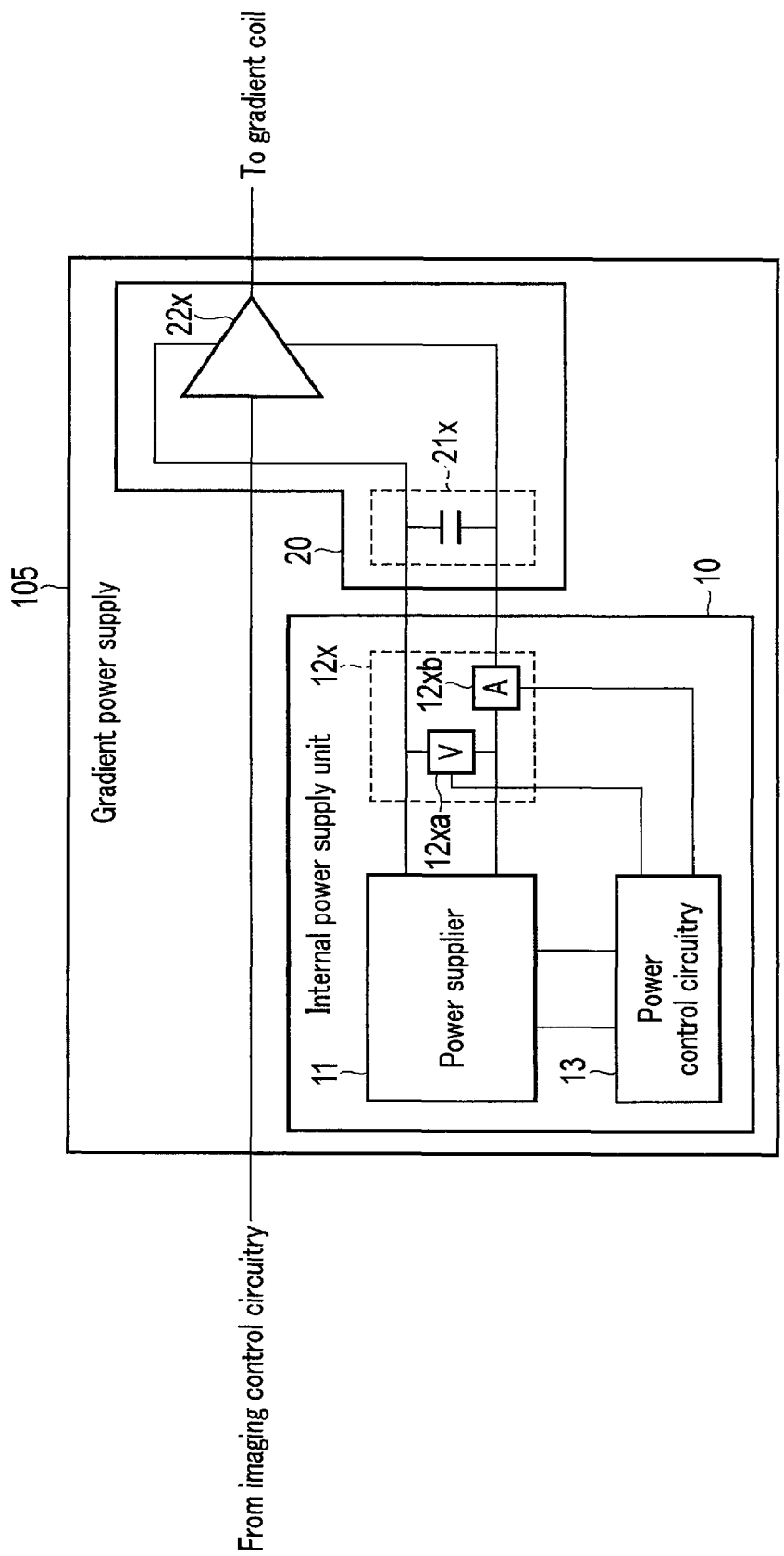
FIG. 3 is a diagram illustrating the circuit configuration of the gradient magnetic field power supply according to the first embodiment.

FIG. 3 is a diagram illustrating the circuit configuration of the gradient magnetic field power supply according to the first embodiment. For the sake of simplicity, FIG. 3 shows only the configuration in relation to the X-axis gradient coil 103x, while the configuration in relation to the Y-axis gradient coil 103y and the Z-axis gradient coil 103z is omitted. For instance, as illustrated in FIG. 3, the gradient magnetic field power supply 105 corresponding to the X-axis gradient coil 103x is provided with the power supplier 11, the X-axis measurement device 12x, the power control circuitry 13, the X-axis capacitor bank 21x, and the X-axis amplifier 22x.

The X-axis measurement device 12x measures the value of the current output from the power supplier 11 to the X-axis amplifier 22x and the value of the voltage corresponding to this current. The X-axis measurement device 12x may be provided with a voltmeter 12xa and an ammeter 12xb. The voltmeter 12xa measures the value of the voltage, and outputs the measured voltage value to the power control circuitry 13. The ammeter 12xb measures the current value, and outputs the measured current value to the power control circuitry 13.

The power control circuitry 13 receives the values of the first voltage ($V_{out\_x}$) and the first current ($I_{out\_x}$) from the X-axis measurement device 12x. The power control circuitry 13 controls the power supplier 11 based on the values of the voltage and current by software control, which is discussed later.

The X-axis capacitor bank 21x is arranged between the power supplier 11 and the X-axis amplifier 22x, and is coupled in parallel to the power supplier 11. The X-axis capacitor bank 21x supplies the power, together with the power supplier 11, to the gradient coil 103.

The X-axis amplifier 22x amplifies the gradient magnetic field waveform received from the imaging control circuitry 121, into a high-current pulse. The X-axis amplifier 22x outputs the amplified high-current pulse to the X-axis gradient coil 103x. The power supply voltage applied to the X-axis amplifier 22x is a direct current voltage generated by the power supplier 11.

FIG. 4 is a diagram illustrating the software configuration of the power control circuitry 13 according to the first embodiment. To realize the current ratio control function, the power control circuitry 13 according to the first embodiment may be provided with a first comparison function 210x, a second comparison function 210y, a third comparison function 210z, a determination function 220, and a feedback control function 230, as illustrated in FIG. 4.

The memory of the power control circuitry 13 stores therein a look-up table (LUT) that associates the values generated by the comparison function with the current ratio, a threshold voltage ($V_{th}$), a reference voltage ($V_{ref}$), and the like. The threshold voltage is set lower than the reference voltage, in consideration of ripple noise. The LUT will be discussed later in detail.

The various functions, which are performed by the first comparison function 210x, the second comparison function 210y, the third comparison function 210z, the determination function 220, and the feedback control function 230, are stored in the memory of the power control circuitry 13 (or in the storage device 127) in the form of a computer-executable program. The power control circuitry 13 is a processor that reads from the memory a program corresponding to each function, and executes the program so that the function corresponding to this program can be realized. The power control circuitry 13 that has read the programs therefore obtains the functions indicated in the power control circuitry 13 of FIG. 4.

The configuration of FIG. 4 has been explained above as including the functions realized by a single power control circuitry 13. However, the power control circuitry 13 may be constituted by combining a plurality of independent processors so that each of the functions can be realized by the corresponding one of the processors implementing a program. That is, the aforementioned functions may be prepared as programs so that the programs can be implemented by one processing circuitry, or a specific function can be implemented by a dedicated and independent program implementing circuit.

The power control circuitry 13 receives a first voltage ($V_{out\_x}$) from the X-axis measurement device 12x with the first comparison function 210x. The power control circuitry 13 compares the first voltage with a threshold voltage, and thereby generates a first comparison result ($V_x$). The first comparison result may be a signal having the truth value of 1 ($V_x$=1) if the first voltage is greater than or equal to the threshold voltage, or may be a signal having the truth value of 0 ($V_x$=0) if the first voltage is smaller than the threshold voltage. The first voltage being greater than or equal to the threshold voltage represents the state of the X-axis capacitor bank 21x being fully charged (charging completed mode), while the first voltage being smaller than the threshold voltage represents the state of the X-axis capacitor bank 21x needing to be charged (charging required mode). The power control circuitry 13 that implements the first comparison function 210x is an example of a means for realizing the first comparator.

The power control circuitry 13 receives a second voltage ($V_{out\_y}$) from the Y-axis measurement device 12y with the second comparison function 210y. The power control circuitry 13 compares the second voltage with the threshold voltage, and thereby generates a second comparison result ($V_y$). The second comparison result may be a signal having the truth value of 1 ($V_y$=1) if the second voltage is greater than or equal to the threshold voltage, or may be a signal having the truth value of 0 ($V_y$=0) if the second voltage is smaller than the threshold voltage. The second voltage being greater than or equal to the threshold voltage represents the state of the Y-axis capacitor bank 21y being fully charged (charging completed mode), while the second voltage being smaller than the threshold voltage represents the state of the Y-axis capacitor bank 21y requiring to be charged (charging required mode). The power control circuitry 13 that implements the second comparison function 210y is an example of a means for realizing the second comparator.

The power control circuitry 13 receives a third voltage ($V_{out\_z}$) from the Z-axis measurement device 12z with the third comparison function 210z. The power control circuitry 13 compares the third voltage with the threshold voltage, and thereby generates a third comparison result ($V_z$). The third comparison result may be a signal having the truth value of 1 ($V_z$=1) if the third voltage is greater than or equal to the threshold voltage, or may be a signal having the truth value of 0 ($V_z$=0) if the third voltage is smaller than the threshold voltage. The third voltage being greater than or equal to the threshold voltage represents the state of the Z-axis capacitor bank 21z being fully charged (charging completed mode), while the third voltage being smaller than the threshold voltage represents the state of the Z-axis capacitor bank 21z needing to be charged (charging required mode). The power control circuitry 13 that implements the third comparison function 210z is an example of a means for realizing the third comparator.

With the determination function 220, the power control circuitry 13 determines the current ratio based on the combination of the first comparison result, the second comparison result, and the third comparison result and based on the LUT. The power control circuitry 13 generates three target currents ($I_{limit\_x}$, $I_{limit\_y}$, and $I_{limit\_z}$) in accordance with the determined current ratio. The power control circuitry 13 that implements the determination function 220 is an example of a means for realizing the determination unit.

The LUT is a correspondence table that associates the first combination with the second combination. The first combination represents a combination of three output values (signals having the respective truth values) generated with the first comparison function 210x, the second comparison function 210y, and the third comparison function 210z. The second combination represents a combination of a first ratio of the first current, a second ratio of the second current, and a third ratio of the third current, relative to the sum of the first current, the second current, and the third current that are output from the power supplier 11. In place of the LUT, the memory may store therein correspondence information that associates the comparison results obtained by the comparators (the first comparator, the second comparator, and the third comparator) with the ratio of the current supplied to each of the amplifiers corresponding to the respective gradient coils relative to the sum of the currents supplied to the amplifiers.

The power control circuitry 13 performs feedback control of the first current, the second current, and the third current that are output from the power supplier 11, using the three target currents ($I_{limit\_x}$, $I_{limit\_y}$, and $I_{limit\_z}$) with the feedback control function 230. The power control circuitry 13 that implements the feedback control function 230 is an example of a means for realizing the feedback controller.

The feedback control function 230 includes a first PID control function 231x, a second PID control function 231y, a third PID control function 231z, a fourth comparison function 232x, a fifth comparison function 232y, a sixth comparison function 232z, a fourth PID control function 233x, a fifth PID control function 233y, and a sixth PID control function 233z.

The feedback process for the output to the X-axis amplifier 22x (X-axis feedback process), the feedback process for the output to the Y-axis amplifier 22y (Y-axis feedback process), and the feedback process for the output to the Z-axis amplifier 22z (Z-axis feedback process) in the power supplier 11 will be explained.

(X-Axis Feedback Process)

With the first PID control function 231x, the power control circuitry 13 receives the first voltage ($V_{out\_x}$) from the X-axis measurement device 12x. The power control circuitry 13 implements the feedback control for the first voltage, using the reference voltage and the first voltage. As a result of the feedback control, the power control circuitry 13 generates a first correction current ($I_{ref\_x}$).

With the fourth comparison function 232x, the power control circuitry 13 compares the first correction current with the first target current ($I_{limit\_x}$), and thereby generates a first reference current ($i_{ref\_x}$) The first reference current is determined to be the first correction current (i.e., $i_{ref\_x}=I_{ref\_x}$) if the first correction current is smaller than or equal to the first target current, and to be the first target current (i.e., $i_{ref\_x}=I_{limit\_x}$) if the first correction current is greater than the first target current.

With the fourth PID control function 233x, the power control circuitry 13 receives the first current ($I_{out\_x}$) from the X-axis measurement device 12x. The power control circuitry 13 performs the feedback control for the first current, using the first reference current and the first current. As a result of the feedback control, the power control circuitry 13 generates a first correction amount to control the full-bridge circuit. The first correction amount may serve as a drive signal that is to be sent to the switching elements of the full-bridge circuit used for supplying the power to the X-axis amplifier 22x.

(Y-Axis Feedback Process)

With the second PID control function 231y, the power control circuitry 13 receives the second voltage ($V_{out\_y}$) from the Y-axis measurement device 12y. The power control circuitry 13 performs the feedback control for the second voltage, using the reference voltage and the second voltage. As a result of the feedback control, the power control circuitry 13 generates a second correction current ($I_{ref\_y}$).

With the fifth comparison function 232y, the power control circuitry 13 compares the second correction current with the second target current ($I_{limit\_y}$), and thereby generates a second reference current ($i_{ref\_y}$). The second reference current is determined as the second correction current (i.e., $i_{ref\_y}=I_{ref\_y}$) if the second correction current is smaller than or equal to the second target current, and is determined as the second target current (i.e., $i_{ref\_y}=I_{limit\_y}$) if the second correction current is greater than the second target current.

With the fifth PID control function 233y, the power control circuitry 13 receives the second current ($I_{out\_y}$) from the Y-axis measurement device 12y. The power control circuitry 13 performs the feedback control for the second current, using the second reference current and the second current. As a result of the feedback control, the power control circuitry 13 generates a second correction amount to control the full-bridge circuit. The second correction amount may serve as a drive signal that is to be sent to the switching elements of the full-bridge circuit configured to supply power to the Y-axis amplifier 22y.

(Z-Axis Feedback Process)

With the third PID control function 231z, the power control circuitry 13 receives the third voltage ($V_{out\_z}$) from the Z-axis measurement device 12z. The power control circuitry 13 performs the feedback control for the third voltage, using the reference voltage and the third voltage. As a result of the feedback control, the power control circuitry 13 generates a third correction current ($I_{ref\_z}$).

With the sixth comparison function 232z, the power control circuitry 13 compares the third correction current with the third target current ($I_{limit\_z}$), and thereby generates a third reference current ($i_{ref\_z}$). The third reference current is determined as a third correction current (i.e., $i_{ref\_z}=I_{ref\_z}$) if the third correction current is smaller than or equal to the third target current, and as a third target current (i.e., $i_{ref\_z}=I_{limit\_z}$) if the third correction current is greater than the third target current.

With the sixth PID control function 233z, the power control circuitry 13 receives a third current ($I_{out\_z}$) from the Z-axis measurement device 12z. The power control circuitry 13 performs the feedback control for the third current, using the third reference current and the third current. As a result of the feedback control, the power control circuitry 13 generates a third correction amount to control the full-bridge circuit. The third correction amount may serve as a drive signal that is to be sent to the switching elements of the full-bridge circuit configured to supply power to the Z-axis amplifier 22z.

In the power supplier 11, the PWM control circuit controls the full-bridge circuit corresponding to the X-axis amplifier 22x, based on the first correction amount. Furthermore, the PWM control circuit of the power supplier 11 controls the full-bridge circuit corresponding to the Y-axis amplifier 22y, based on the second correction amount. The PWM control circuit of the power supplier 11 further controls the full-bridge circuit corresponding to the Z-axis amplifier 22z, based on the third correction amount. Under the above controls, the power supplier 11 supplies a current to each of the X-axis amplifier 22x, the Y-axis amplifier 22y, and the Z-axis amplifier 22z.

Figure 5:
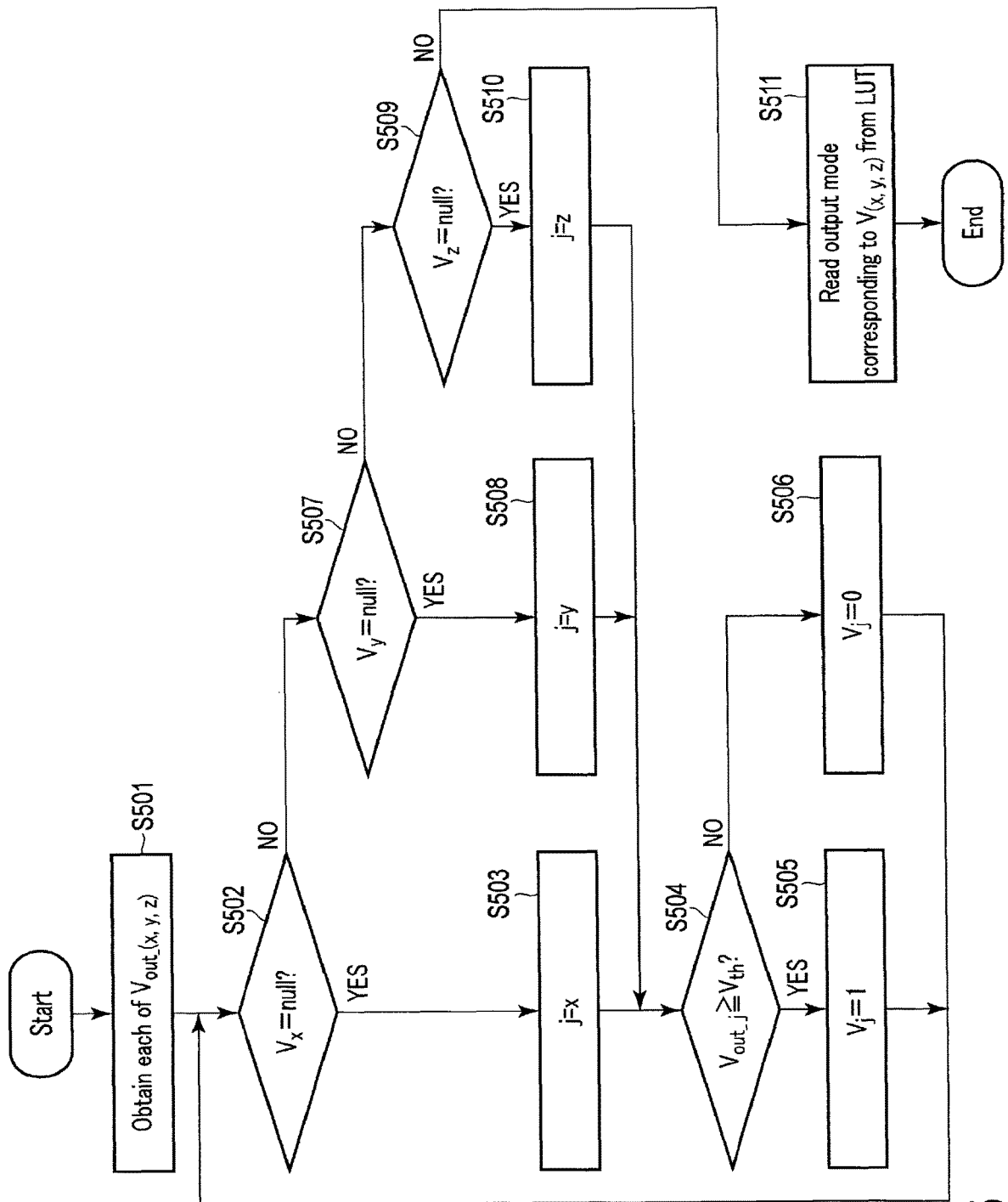
FIG. 5 is a flowchart of a process implemented by the power control circuitry according to the first embodiment.

FIG. 5 is a flowchart of a process implemented by the power control circuitry according to the first embodiment. The process implemented by the current ratio control function of the power control circuitry 13 will be explained.

First, the magnetic resonance imaging apparatus 100 reads the imaging protocol from the storage device 127 with the system control function 129a, based on the imaging conditions input by the operator. The magnetic resonance imaging apparatus 100 transmits the imaging protocol to the imaging control circuitry 121, and thereby controls the imaging of the subject P. Here, the power control circuitry 13 of the gradient magnetic field power supply 105 starts the operation at step S501 at the timing of initiating the imaging of the subject P.

(Step S501)

The power control circuitry 13 obtains the value of the first voltage ($V_{out\_x}$) from the X-axis measurement device 12x, the value of the second voltage ($V_{out\_y}$) from the Y-axis measurement device 12y, and the value of the third voltage ($V_{out\_z}$) from the Z-axis measurement device 12z.

(Step S502)

The power control circuitry 13 determines whether or not a value is input to the first comparison result ($V_x$) ($V_x$=null?). If no value is input to the $V_x$, the process proceeds to step S503. If any value is input to the $V_x$, the process proceeds to step S507.

(Step S503)

The power control circuitry 13 substitutes x for a variable j, and the process proceeds to step S504. With this substitution, the power control circuitry 13 performs the operations, letting $V_{out\_j}=V_{out\_x}$ and $V_j=V_x$ during the subsequent steps S504 to S506.

(Step S504)

With the first comparison function 210x, the power control circuitry 13 determines whether the first voltage ($V_{out\_x}$) is greater than or equal to the threshold voltage ($V_{th}$). If the first voltage is greater than or equal to the threshold voltage, the process proceeds to step S505. If the first voltage is smaller than the threshold voltage, the process proceeds to step S506.

When y is substituted for the variable j, the power control circuitry 13 determines, with the second comparison function 210y, whether the second voltage ($V_{out\_y}$) is greater than or equal to the threshold voltage ($V_{th}$). The process proceeds to step S505 when the second voltage is greater than or equal to the threshold voltage. If the second voltage is smaller than the threshold voltage, the process proceeds to step S506.

When z is substituted for the variable j, the power control circuitry 13 determines, with the third comparison function 210z, whether the third voltage ($V_{out\_z}$) is greater than or equal to the threshold voltage ($V_{th}$). If the third voltage is greater than or equal to the threshold voltage, the process proceeds to step S505. If the third voltage is smaller than the threshold voltage, the process proceeds to step S506.

(Step S505)

With the first voltage being greater than or equal to the threshold voltage, the power control circuitry 13 generates the first comparison result ($V_x$) having a value of "1".

When y is substituted for the variable j, the power control circuitry 13 generates the second comparison result ($V_y$) having a value of "1", with the second voltage being greater than or equal to the threshold voltage.

When z is substituted for the variable j, the power control circuitry 13 generates the third comparison result ($V_z$) having a value of "1", with the third voltage being greater than or equal to the threshold voltage. After step S505, the process returns to step S502.

(Step S506)

With the first voltage being smaller than the threshold voltage, the power control circuitry 13 generates the first comparison result ($V_x$) having a value of "0".

When y is substituted for the variable j, the power control circuitry 13 generates the second comparison result ($V_y$) having a value of "0", with the second voltage being smaller than the threshold voltage.

When z is substituted for the variable j, the power control circuitry 13 generates the third comparison result ($V_z$) having a value of "0", with the third voltage being smaller than the threshold voltage. After step S506, the process returns to step S502.

(Step S507)

The power control circuitry 13 determines whether or not any value is input to the second comparison result ($V_y$) ($V_y$=null?). If no value is input to $V_y$, the process proceeds to step S508. If a value is input to $V_y$, the process proceeds to step S509.

(Step S508)

The power control circuitry 13 substitutes y for the variable j, and the process proceeds to step S504. With this substitution, the power control circuitry 13 performs the operations, letting $V_{out\_j}=V_{out\_y}$ and $V_j=V_y$ during the subsequent steps S504 to S506.

(Step S509)

The power control circuitry 13 determines whether or not any value is input to the third comparison result ($V_z$) ($V_z$=null?). If no value is input to $V_z$, the process proceeds to step S510. If a value is input to $V_z$, the process proceeds to step S511.

(Step S510)

The power control circuitry 13 substitutes z for the variable j, and the process proceeds to step S504. With this substitution, the power control circuitry 13 performs the operations, letting $V_{out\_j}=V_{out\_z}$ and $V_j=V_z$, during the subsequent steps S504 to S506.

(Step S511)

With the determination function 220, the power control circuitry 13 reads the output mode ($I_{limit\_x}$, $I_{limit\_y}$, $I_{limit\_z}$) corresponding to the first combination of the first comparison result ($V_x$), the second comparison result ($V_y$) and the third comparison result ($V_z$) from the LUT.

After step S511, the values of the first comparison result ($V_x$), the second comparison result ($V_y$), and the third comparison result ($V_z$) are reset, and the process is terminated. When the value of the first comparison result is reset, "$V_x$=null". When the value of the second comparison result is reset, "$V_y$=null", and when the value of the third comparison result is reset, "$V_z$=null". The operations are repeated until all of the X-axis capacitor bank 21x, the Y-axis capacitor bank 21y, and the Z-axis capacitor bank 21z are brought into the charging completed mode.

The operations from step S502 to step S510 may be performed in parallel. The operation of step S511 is performed with the determination function 220 at the timing of all of the first comparison result ($V_x$), the second comparison result ($V_y$), and the third comparison result ($V_z$) having been obtained to form the first combination.

FIG. 6 is a LUT according to the first embodiment. In the LUT 600 according to the first embodiment, the first combination of $V_x$, $V_y$, and $V_z$ are associated with the second combination of $I_{limit\_y}$, $I_{limit\_y}$, and $I_{limit\_z}$, as shown in FIG. 6. The first combination includes three output values (signals having the respective truth values) generated respectively in accordance with the first comparison function 210x, the second comparison function 210y, and the third comparison function 210z. The second combination includes the first ratio of the first current, the second ratio of the second current, and the third ratio of the third current in integral percentage (%), relative to the sum of the first current, the second current, and the third current (total current amount) that are output from the power supplier 11.

A combination 601 of ($V_x$, $V_y$, $V_z$)=(1, 1, 1) represents all of the X-axis capacitor bank 21x, the Y-axis capacitor bank 21y, and the Z-axis capacitor bank 21z being in the charging completed mode. A combination 602 of ($I_{limit\_x}$, $I_{limit\_y}$, $I_{limit\_z}$)=(33, 33,33), which corresponds to the combination 601, represents approximately the same amount of current assigned to the X-axis capacitor bank 21x, the Y-axis capacitor bank 21y, and the Z-axis capacitor bank 21z.

A combination 603 of ($V_x$, $V_y$, $V_z$)=(1, 1, 0) represents the X-axis capacitor bank 21x and the Y-axis capacitor bank 21y being in the charging completed mode and the Z-axis capacitor bank 21z being in the charging required mode. A combination 604 of $(I_{limit\_x}, I_{limit\_y}, I_{limit\_z})=(4, 4, 92)$, which corresponds to the combination 603, represents the assignment of an amount of current to the Z-axis capacitor bank 21z on a priority basis.

A combination 605 of $(V_x, V_y, V_z)=(1, 0, 1)$ represents the X-axis capacitor bank 21x and the Z-axis capacitor bank 21z being in the charging completed mode, and the Y-axis capacitor bank 21y being in the charging required mode. A combination 606 of $(I_{limit\_x}, I_{limit\_y}, I_{limit\_z})=(4, 92, 4)$, which corresponds to the combination 605, represents an amount of current assigned to the Y-axis capacitor bank 21y on a priority basis.

A combination 607 of $(V_x, V_y, V_z)=(1, 0, 0)$ represents the X-axis capacitor bank 21x being in the charging completed mode, and the Y-axis capacitor bank 21y and the Z-axis capacitor bank 21z being in the charging required mode. A combination 608 of $(I_{limit\_x}, I_{limit\_y}, I_{limit\_z})=(4, 48, 48)$, which corresponds to the combination 607, represents amounts of current assigned to the Y-axis capacitor bank 21y and the Z-axis capacitor bank 21z on a priority basis.

A combination 609 of $(V_x, V_y, V_z)=(0, 0, 0)$ represents all of the X-axis capacitor bank 21x, the Y-axis capacitor bank 21y, and the Z-axis capacitor bank 21z being in the charging required mode. A combination 610 of $(I_{limit\_x}, I_{limit\_y}, I_{limit\_z})=(33, 33, 33)$, which corresponds to the combination 609, represents approximately the same amount of current assigned to the X-axis capacitor bank 21x, the Y-axis capacitor bank 21y, and the Z-axis capacitor bank 21z.

As discussed above, the magnetic resonance imaging apparatus 100 according to the first embodiment is provided with a plurality of gradient coils configured to receive power supply and generate gradient magnetic fields having different axes, and a gradient magnetic field power supply configured to supply power. The gradient magnetic field power supply is provided with a plurality of amplifiers respectively coupled to the gradient coils, a power supplier that supplies currents to the amplifiers, a measurement device that measures the voltages applied to the amplifiers, and a power control circuitry that controls the currents supplied from the power supplier to the amplifiers. The power control circuitry is provided with a comparator that compares the voltages applied to the amplifiers with the threshold voltage, and a memory that stores therein the correspondence information associating the comparison results obtained by the comparator with the ratio of the current supplied to each of the amplifiers corresponding to the gradient coils relative to the sum of the currents supplied to all the amplifiers. With the above structure, the magnetic resonance imaging apparatus 100 controls the assignment of the current that is output from the power supplier, using software. Furthermore, because of the software control, the magnetic resonance imaging apparatus 100 efficiently controls the assignment of the current that is output from the power supplier.

The magnetic resonance imaging apparatus 100 according to the present embodiment is provided with an X-axis gradient coil, a Y-axis gradient coil, a Z-axis gradient coil, and a gradient magnetic field power supply. The gradient magnetic field power supply includes a power supplier, a measurement device, and a power control circuitry. The power supplier supplies the first current, the second current, and the third current respectively to the three amplifiers coupled to the X-axis gradient coil, the Y-axis gradient coil, and the Z-axis gradient coil. The measurement device measures the first voltage corresponding to the first current, the second voltage corresponding to the second current, and the third voltage corresponding to the third current. The power control circuitry uses the first voltage, the second voltage, and the third voltage to control the first current, the second current, and the third current. The power control circuitry is provided with the first comparator, the second comparator, the third comparator, the memory, and the determination unit. The first comparator compares the first voltage with the threshold voltage to generate the first comparison result. The second comparator compares the second voltage with the threshold voltage to generate the second comparison result. The third comparator compares the third voltage with the threshold voltage to generate the third comparison result. The memory stores therein a look-up table that associates the first combination of the three comparison results generated by the first comparator, the second comparator, and the third comparator, with the second combination of the first ratio of the first current, the second ratio of the second current, and the third ratio of the third current, relative to the sum of the first current, the second current, and the third current. The determination unit determines the second combination, based on the combinations of the first comparison result, the second comparison result, and the third comparison result, and also on the look-up table. The power control circuitry controls the power supplier in accordance with the determined second combination. With the above structure, the magnetic resonance imaging apparatus 100 controls the assignment of the current that is output from the power supplier, using the software.

In the magnetic resonance imaging apparatus 100, the power control circuitry is further provided with a feedback control unit that performs the feedback control of the first current, the second current, and the third current, using the determined second combination. With the above structure, the magnetic resonance imaging apparatus 100 controls the assignment of the current that is output from the power supplier, using the software.

Second Embodiment 2

In the magnetic resonance imaging apparatus according to the first embodiment, the power control circuitry 13 supplies power to an amplifier corresponding to a certain channel on a priority basis, in accordance with the output voltage of the power supplier. In contrast, in the magnetic resonance imaging apparatus according to the second embodiment, a power control circuitry 13' supplies power to an amplifier corresponding to a certain channel on a priority basis, in accordance with a voltage gradient, which represents the temporal change of the output voltage. Other than the structure of the power control circuitry 13', the magnetic resonance imaging apparatus according to the second embodiment has the same structure as the magnetic resonance imaging apparatus according to the first embodiment, and therefore the explanation of the same structure is omitted.

The power control circuitry 13' includes as hardware resources a processor and memories such as a ROM and RAM (not shown), and controls the power supplier 11. The power control circuitry 13' receives the values of the measured currents and voltages from the X-axis measurement device 12x, the Y-axis measurement device 12y, and the Z-axis measurement device 12z. With the current ratio control function, the power control circuitry 13' controls the first current, the second current, and the third current that are to be supplied respectively to the X-axis amplifier 22x, the Y-axis amplifier 22y, and the Z-axis amplifier 22z, using the first voltage, the second voltage, and the third voltage measured by the measurement device 12. The power control circuitry 13', which receives various data, may be referred to as an acquisition unit.

FIG. 7 is a diagram illustrating the software configuration of the power control circuitry 13' according to the second embodiment. To realize the current ratio control function, the power control circuitry 13' according to the second embodiment may be provided, as illustrated in FIG. 7, with a first voltage comparison function 710x, a second voltage comparison function 710y, a third voltage comparison function 710z, a first low pass filter (LPF) function 720x, a second LPF function 720y, a third LPF function 720z, a first differentiation function 730x, a second differentiation function 730y, a third differentiation function 730z, a first gradient comparison function 740x, a second gradient comparison function 740y, a third gradient comparison function 740z, a determination function 750, a current setting function 760, and a feedback control function 770.

The memory of the power control circuitry 13' stores therein a, look-up table (LUT) that associates the values generated by the comparison functions with the current ratios, a threshold gradient value ($dV_{th}$), a threshold voltage ($V_{th}$), an upper limit voltage ($V_{limit}$), a reference voltage ($V_{ref}$), and the like. The threshold gradient value is employed to determine whether or not there is a gradient, and thus may be set to any value smaller than zero. The threshold voltage is set lower than the reference voltage, in consideration of ripple noise. The upper limit voltage is set higher than the reference voltage, in consideration of ripple noise. The LUT will be discussed later in detail.

The various functions, which are performed by the first voltage comparison function 710x, the second voltage comparison function 710y, the third voltage comparison function 710z, the first LPF function 720x, the second LPF function 720y, the third LPF function 720z, the first differentiation function 730x, the second differentiation function 730y, the third differentiation function 730z, the first gradient comparison function 740x, the second gradient comparison function 740y, the third gradient comparison function 740z, the determination function 750, the current setting function 760, and the feedback control function 770, are stored in the memory of the power control circuitry 13' (or in the storage device 127) in the form of computer-executable programs. The power control circuitry 13' is a processor that reads from the memory a program corresponding to each function, and executes the program so that the function corresponding to this program can be realized. In other words, the power control circuitry 13' that has read the programs is not provided with the functions as indicated in the power control circuitry 13' of FIG. 7.

The configuration of FIG. 7 has been explained above as having the functions that are realized by a single power control circuitry 13'. However, the power control circuitry 13' may be constituted by combining a plurality of independent processors so that the functions can be realized by each processor executing a program. That is, the aforementioned functions may be prepared as programs so that the programs can be implemented by one processing circuitry, or a specific function can be implemented by a dedicated and independent program implementing circuit.

With the first voltage comparison function 710x, the power control circuitry 13' receives a first voltage ($V_{out\_x}$) from the X-axis measurement device 12x. The power control circuitry 13' compares the first voltage with a threshold voltage, and thereby generates a first voltage comparison result ($V_x$). The first voltage comparison result may be a signal having the truth value of 1 ($V_x$=1) if the first voltage is greater than or equal to the threshold voltage, or may be a signal having the truth value of 0 ($V_x$=0) if the first voltage is smaller than the threshold voltage. The first voltage being greater than or equal to the threshold voltage represents the state of the X-axis capacitor bank 21x being fully charged (charging completed mode), while the first voltage being smaller than the threshold voltage represents the state of the X-axis capacitor bank 21x needing to be charged (charging required mode). The power control circuitry 13' that implements the first voltage comparison function 710x is an example of a means for realizing the first comparator.

The power control circuitry 13' receives a second voltage ($V_{out\_y}$) from the Y-axis measurement device 12y with the second voltage comparison function 710y. The power control circuitry 13' compares the second voltage with the threshold voltage to generate a second voltage comparison result ($V_y$). The second voltage comparison result may be a signal having the truth value of 1 ($V_y$=1) if the second voltage is greater than or equal to the threshold voltage, or may be a signal having the truth value of 0 ($V_y$=0) if the second voltage is smaller than the threshold voltage. The second voltage being greater than or equal to the threshold voltage represents the state of the Y-axis capacitor bank 21y being fully charged (charging completed mode), while the second voltage being smaller than the threshold voltage represents the state of the Y-axis capacitor bank 21y needing to be charged (charging required mode). The power control circuitry 13' that implements the second voltage comparison function 710y is an example of a means for realizing the second comparator.

With the third voltage comparison function 710z, the power control circuitry 13' receives the third voltage ($V_{out\_z}$) from the Z-axis measurement device 12z. The power control circuitry 13' compares the third voltage with the threshold voltage, and thereby generates a third voltage comparison result ($V_z$). The third voltage comparison result may be a signal having the truth value of 1 ($V_z$=1) if the first voltage is greater than or equal to the threshold voltage, or may be a signal having the truth value of 0 ($V_z$=0). The third voltage being greater than or equal to the threshold voltage represents the state of the Z-axis capacitor bank 21z being fully charged (charging completed mode), while the third voltage being smaller than the threshold voltage represents the state of the Z-axis capacitor bank 21z needing to be charged (charging required mode). The power control circuitry 13' that implements the third voltage comparison function 710z is an example of a means for realizing the third comparator. The first comparator, the second comparator, and the third comparator may be collectively referred to as a voltage comparator.

With the first LPF function 720x, the power control circuitry 13' receives the first voltage ($V_{out\_x}$) from the X-axis measurement device 12x. The power control circuitry 13' attenuates the high frequency component of the first voltage, and thereby generates a first low frequency signal. The power control circuitry 13' that implements the first LPF function 720x may be an example of a means for realizing a first LPF unit.

With the second LPF function 720y, the power control circuitry 13' receives the second voltage ($V_{out\_y}$) from the Y-axis measurement device 12y. The power control circuitry 13' attenuates the high frequency component of the second voltage, and thereby generates a second low frequency signal. The power control circuitry 13' that implements the second LPF function 720y may be an example of a means for realizing a second LPF unit.

With the third LPF function 720z, the power control circuitry 13' receives a third voltage ($V_{out\_z}$) from the Z-axis measurement device 12z. The power control circuitry 13' attenuates the high frequency component of the third voltage, and thereby generates a third low frequency signal. The power control circuitry 13' that implements the third LPF function 720z may be an example of a means for realizing a third LPF unit.

The first LPF function 720x, the second LPF function 720y, and the third LPF function 720z may suffice as long as they can diminish the ripple noise that is superimposed on the first voltage, the second voltage, and the third voltage. The first LPF function 720x, the second LPF function 720y, and the third LPF function 720z are therefore not limited to the LPF function.

With the first differentiation function 730x, the power control circuitry 13' performs a differential operation onto the first low frequency signal with respect to the time, and thereby generates a first gradient value ($dV_{out\_x}$). If the first LPF function 720x is not implemented, the power control circuitry 13' may perform a differential operation onto the first voltage so as to generate the first gradient value. The first gradient value indicates the temporal change of the first low frequency signal (or the first voltage).

With the second differentiation function 730y, the power control circuitry 13' performs a differential operation onto the second low frequency signal with respect to the time, and thereby generates a second gradient value ($dV_{out\_y}$). If the second LPF function 720y is not implemented, the power control circuitry 13' may perform a differential operation onto the second voltage so as to generate the second gradient value. The second gradient value indicates the temporal change of the second low frequency signal (or the second voltage).

With the third differentiation function 730z, the power control circuitry 13' performs a differential operation onto the third low frequency signal with respect to the time, and thereby generates a third gradient value ($dV_{out\_z}$) If the third LPF function 720z is not implemented, the power control circuitry 13' may perform a differential operation onto the third voltage so as to generate the third gradient value. The third gradient value indicates the temporal change of the third low frequency signal (or the third voltage).

With the first gradient comparison function 740x, the power control circuitry 13' compares the first gradient value with the threshold gradient value, and thereby generates a first gradient comparison result ($dV_x$). The threshold gradient value may denote a gradient per unit of time. The first gradient comparison result may be a signal having the truth value of 1 ($dV_x=1$) when the first gradient value is greater than or equal to the threshold gradient value, or may be a signal having the truth value of 0 ($dV_x=0$) when the first gradient value is smaller than the threshold gradient value. The first gradient value being greater than or equal to the threshold gradient value indicates the state in which the electrical charge of the X-axis capacitor bank 21x is being discharged (discharging mode). The power control circuitry 13' that implements the first gradient comparison function 740x is an example of a means for realizing the fourth comparator.

With the second gradient comparison function 740y, the power control circuitry 13' compares the second gradient value with the threshold gradient value, and thereby generates a second gradient comparison result ($dV_y$). The second gradient comparison result may be a signal having the truth value of 1 ($dV_y=1$) if the second gradient value is greater than or equal to the threshold gradient value, or may be a signal having the truth value of 0 ($dV_y=0$) if the second gradient value is smaller than the threshold gradient value. The second gradient value being greater than or equal to the threshold gradient value indicates the state in which the electrical charge of the Y-axis capacitor bank 21y is being discharged (discharging mode). The power control circuitry 13' that implements the second gradient comparison function 740y is an example of a means for realizing the fifth comparator.

With the third gradient comparison function 740z, the power control circuitry 13' compares the third gradient value with the threshold gradient value, and thereby generates a third gradient comparison result ($dV_z$). The third gradient comparison result may be a signal having the truth value of 1 ($dV_z=1$) if the third gradient value is greater than or equal to the threshold gradient value, or may be a signal having the truth value of 0 ($dV_z=0$) if the third gradient value is smaller than the threshold gradient value. The third gradient value being greater than or equal to the threshold gradient value indicates the state in which the electrical charge of the Z-axis capacitor bank 21z is being discharged (discharging mode). The power control circuitry 13' that implements the third gradient comparison function 740z is an example of a means for realizing the sixth comparator. The fourth, fifth, and sixth comparators may be collectively referred to as a voltage gradient comparator.

With the determination function 750, the power control circuitry 13' determines the current ratio based on the combination of the first voltage comparison result, the second voltage comparison result, the third voltage comparison result, the first gradient comparison result, the second gradient comparison result, and the third gradient comparison result and also based on the LUT. The power control circuitry 13' generates three target currents ($I_{limit\_x}$, $I_{limit\_y}$, $I_{limit\_z}$) corresponding to the determined current ratio. The power control circuitry 13' that implements the determination function 750 is an example of a means for realizing the determination unit.

The LUT is a correspondence table that associates the first combination with the second combination. The first combination denotes a combination of the six output values (signals having the respective truth values) generated in accordance with the first voltage comparison function 710x, the second voltage comparison function 710y, the third voltage comparison function 710z, the first gradient comparison function 740x, the second gradient comparison function 740y, and the third gradient comparison function 740z. The second combination denotes a combination of a first ratio of the first current, a second ratio of the second current, a third ratio of the third current, relative to the sum of the first current, the second current, and the third current output from the power supplier 11.

With the current setting function 760, the power control circuitry 13' sets the target current to zero when the voltage value exceeds the upper limit voltage. Specifically, the power control circuitry 13' sets the first target current in accordance with the first ratio when the first voltage is smaller than the upper limit voltage, and sets the first target current to zero when the first voltage is greater than or equal to the upper limit voltage. Furthermore, the power control circuitry 13' sets the second target current in accordance with the second ratio when the second voltage is smaller than the upper limit voltage, and sets the second target current to zero when the second voltage is greater than or equal to the upper limit voltage. Furthermore, the power control circuitry 13' sets the third target current in accordance with the third ratio when the third voltage is smaller than the upper limit voltage, and sets the third voltage to zero when the upper limit voltage is greater than or equal to the third target current. The power control circuitry 13' that implements the current setting function 760 is an example of a means for realizing the current setting unit.

The current setting function 760 is provided with a fourth voltage comparison function 761x, a fifth voltage comparison function 761y, a sixth voltage comparison function 761z, a fourth LPF function 762x, a fifth LPF function 762y, a sixth LPF function 762z, a first signal selection function 763x, a second signal selection function 763y, and a third signal selection function 763z.

The current setting process regarding the output to the X-axis amplifier 22x (X-axis current setting process), the current setting process regarding the output to the Y-axis amplifier 22y (Y-axis current setting process), and the current setting process regarding the output to the Z-axis amplifier 22z (Z-axis current setting process) in the power supplier 11 will be explained.

(X-Axis Current Setting Process)

With the fourth voltage comparison function 761x, the power control circuitry 13' receives the first voltage ($V_{out\_x}$) from the X-axis measurement device 12x. The power control circuitry 13' compares the first voltage with the upper limit voltage, and thereby generates a first selection signal. The first selection signal may be a signal having the truth value of 1 when the first voltage is greater than or equal to the upper limit voltage, or may be a signal having the truth value of 0 when the first voltage is smaller than the upper limit voltage. The first voltage being greater than or equal to the upper limit voltage represents the state of the first voltage being overshot, while the first voltage being smaller than the upper limit voltage represents the state of the first voltage being within the range of ordinary use.

With the fourth LPF function 762x, the power control circuitry 13' averages out the fluctuations of the value of the first target current, and thereby generates the averaged first target current. With the averaging operation, a stable first target current can be established even if the first target current fluctuates in a short cycle.

With the first signal selection function 763x, the power control circuitry 13' selects the averaged first target current or the current value of 0. Specifically, the power control circuitry 13' selects the current value of 0 when the first selection signal has the truth value of 1, while the power control circuitry 13' selects the averaged first target current when the first selection signal has the truth value of 0.

(Y-Axis Current Setting Process)

With the fifth voltage comparison function 761y, the power control circuitry 13' receives the second voltage ($V_{out\_y}$) from the Y-axis measurement device 12y. The power control circuitry 13' compares the second voltage with the upper limit voltage, and thereby generates a second selection signal. The second selection signal may be a signal having the truth value of 1 when the second voltage is greater than or equal to the upper limit voltage, and the second voltage may be a signal having the truth value of 0 when the second voltage is smaller than the upper limit voltage. The second voltage being greater than or equal to the upper limit voltage represents the state of the second voltage being overshot, while the second voltage being smaller than the upper limit voltage represents the state of the second voltage being within the range of ordinary use.

With the values of the fifth LPF function 762y, the power control circuitry 13' averages out the fluctuations of the value of the second target current, and thereby generates the averaged second target current. With the averaging operation, a stable second target current can be established even if the second target current fluctuates in a short cycle.

With the second signal selection function 763y, the power control circuitry 13' selects either the averaged second target current or the current value of 0. Specifically, the power control circuitry 13' selects the current value of 0 if the second selection signal has the truth value of 1, while the power control circuitry 13' selects the averaged second target current if the second selection signal has the truth value of 0.

(Z-Axis Current Setting Process)

With the sixth voltage comparison function 761z, the power control circuitry 13' receives the third voltage ($V_{out\_z}$) from the Z-axis measurement device 12z. The power control circuitry 13' compares the third voltage with the upper limit voltage, and thereby generates a third selection signal. The third selection signal may be a signal having the truth value of 1 if the third voltage is greater than or equal to the upper limit voltage, or may be a signal having the truth value of 0 if the third voltage is smaller than the upper limit voltage. The third voltage being greater than or equal to the upper limit voltage represents the state of the third voltage being overshot, while the third voltage being smaller than the upper limit voltage represents the state of the third voltage being within the range of ordinary use.

With the sixth LPF function 762z, the power control circuitry 13' averages out the fluctuations of the value of the third target current, and thereby generates the averaged third target current. With the averaging operation, a stable third target current can be established even if the third target current fluctuates in a short cycle.

With the third signal selection function 763z, the power control circuitry 13' selects the averaged third target current or the current value zero. Specifically, the power control circuitry 13' selects the current value of 0 if the third selection signal has the truth value of 1, while the power control circuitry 13' selects the averaged third target current if the third selection signal has the truth value of 0.

The cutoff frequency is set higher for the fourth LPF function 762x, the fifth LPF function 762y, and the sixth LPF function 762z, than for the first LPF function 720x, the second LPF function 720y, and the third LPF function 720z.

The power control circuitry 13' performs the feedback control onto the first current, the second current, and the third current that are output from the power supplier 11 with the feedback control function 770, using the three target currents ($I_{limit\_x}$, $I_{limit\_y}$, $I_{limit\_z}$), respectively. The power control circuitry 13' that implements the feedback control function 770 is an example of a means for realizing the feedback controller.

The feedback control function 770 is provided with a first PID control function 771x, a second PID control function 771y, a third PID control function 771z, a first current comparison function 772x, a second current comparison function 772y, a third current comparison function 772z, a fourth PID control function 773x, a fifth PID control function 773y, and a sixth PID control function 773z.

The feedback processes for the output to the X-axis amplifier 22x (X-axis feedback process), the feedback processes for the output to the Y-axis amplifier 22y (Y-axis feedback process), and the feedback processes for the output to the Z-axis amplifier 22z (Z-axis feedback process) in the power supplier 11 will be explained below.

(X-Axis Feedback Process)

The power control circuitry 13' receives the first voltage ($V_{out\_x}$) from the X-axis measurement device 12x with the first PID control function 771x. The power control circuitry

13' implements the feedback control for the first voltage, using the reference voltage and the first voltage. The power control circuitry 13' generates the first correction current ($I_{ref\_x}$) as the result of the feedback control.

With the first current comparison function 772x, the power control circuitry 13' compares the first correction current with the first target current ($I_{limit\_x}$), and thereby generates a first reference current ($i_{ref\_x}$). The first reference current may be determined as the first correction current (i.e., $i_{ref\_x} = I_{ref\_x}$) when the first correction current is smaller than or equal to the first target current, while the first reference current may be determined as the first target current (i.e., $i_{ref\_x} = I_{limit\_x}$) when the first correction current is greater than the first target current. The first target current may be replaced with the averaged first target current.

With the fourth PID control function 773x, the power control circuitry 13' receives the first current ($I_{out\_x}$) from the X-axis measurement device 12x. The power control circuitry 13' performs the feedback control for the first current, using the first reference current and the first current. As a result of the feedback control, the power control circuitry 13' generates the first correction amount to control the full-bridge circuit. The first correction amount serves as a drive signal that is to be sent to the switching elements of the full-bridge circuit configured to supply power to the X-axis amplifier 22x.

(Y-Axis Feedback Process)

With the second PID control function 771y, the power control circuitry 13' receives the second voltage ($V_{out\_y}$) from the Y-axis measurement device 12y. The power control circuitry 13' implements the feedback control for the second voltage, using the reference voltage and the second voltage. As a result of the feedback control, the power control circuitry 13' generates a second correction current ($I_{ref\_y}$).

With the second current comparison function 772y, the power control circuitry 13' compares the second correction current with the second target current ($I_{limit\_y}$), and thereby generates the second reference current ($i_{ref\_y}$). The second reference current may be determined as the second correction current (i.e., $i_{ref\_y} = I_{ref\_y}$) if the second correction current is smaller than or equal to the second target current, while the second reference current may be determined as the second target current (i.e., $i_{ref\_y} = I_{limit\_y}$) if the second correction current is greater than the second target current. The second target current may be replaced with the averaged second target current.

With the fifth PID control function 773y, the power control circuitry 13' receives the second current ($I_{out\_y}$) from the Y-axis measurement device 12y. The power control circuitry 13' performs the feedback control for the second current, using the second reference current and the second current. As a result of the feedback control, the power control circuitry 13' generates a second correction amount to control the full-bridge circuit. The second correction amount serves as a drive signal that is to be sent to the switching elements of the full-bridge circuit configured to supply power to the Y-axis amplifier 22y.

(Z-Axis Feedback Process)

With the third PID control function 771z, the power control circuitry 13' receives the third voltage ($V_{out\_z}$) from the Z-axis measurement device 12z. The power control circuitry 13' implements the feedback control for the third voltage, using the reference voltage and the third voltage. As a result of the feedback control, the power control circuitry 13' generates a third correction current ($I_{ref\_z}$).

With the third current comparison function 772z, the power control circuitry 13' compares the third correction current with the third target current ($I_{limit\_z}$), and thereby generates a third reference current ($i_{ref\_z}$). The third reference current is determined as the third correction current (i.e., $i_{ref\_z} = I_{ref\_z}$) if the third correction current is smaller than or equal to the third target current, while the third reference current is determined as the third target current (i.e., $i_{ref\_z} = I_{limit\_z}$) if the third correction current is greater than the third target current. The third target current may be replaced with the averaged third target current.

With the sixth PID control function 773z, the power control circuitry 13' receives a third current ($I_{out\_z}$) from the Z-axis measurement device 12z. The power control circuitry 13' performs the feedback control for the third current, using the third reference current and the third current. As a result of the feedback control, the power control circuitry 13' generates a third correction amount to control the full-bridge circuit. The third correction amount serves as a drive signal that is to be sent to the switching elements of the full-bridge circuit configured to supply power to the Z-axis amplifier 22z.

In the power supplier 11, the PWM control circuit controls the full-bridge circuit corresponding to the X-axis amplifier 22x, using the first correction amount. The PWM control circuit of the power supplier 11 further controls the full-bridge circuit corresponding to the Y-axis amplifier 22y, using the second correction amount. The PWM control circuit of the power supplier 11 also controls the full-bridge circuit corresponding to the Z-axis amplifier 22z, using the third correction amount. Under the above controls, the power supplier 11 supplies a current to each of the X-axis amplifier 22x, the Y-axis amplifier 22y, and the Z-axis amplifier 22z. When the first target current is set to zero, the power supplier 11 interrupts the supply of the current to the X-axis amplifier 22x. When the second target current is set to zero, the power supplier 11 interrupts the supply of the current to the Y-axis amplifier 22y. When the third target current is set to zero, the power supplier 11 interrupts the supply of the current to the Z-axis amplifier 22z.

Figure 8:
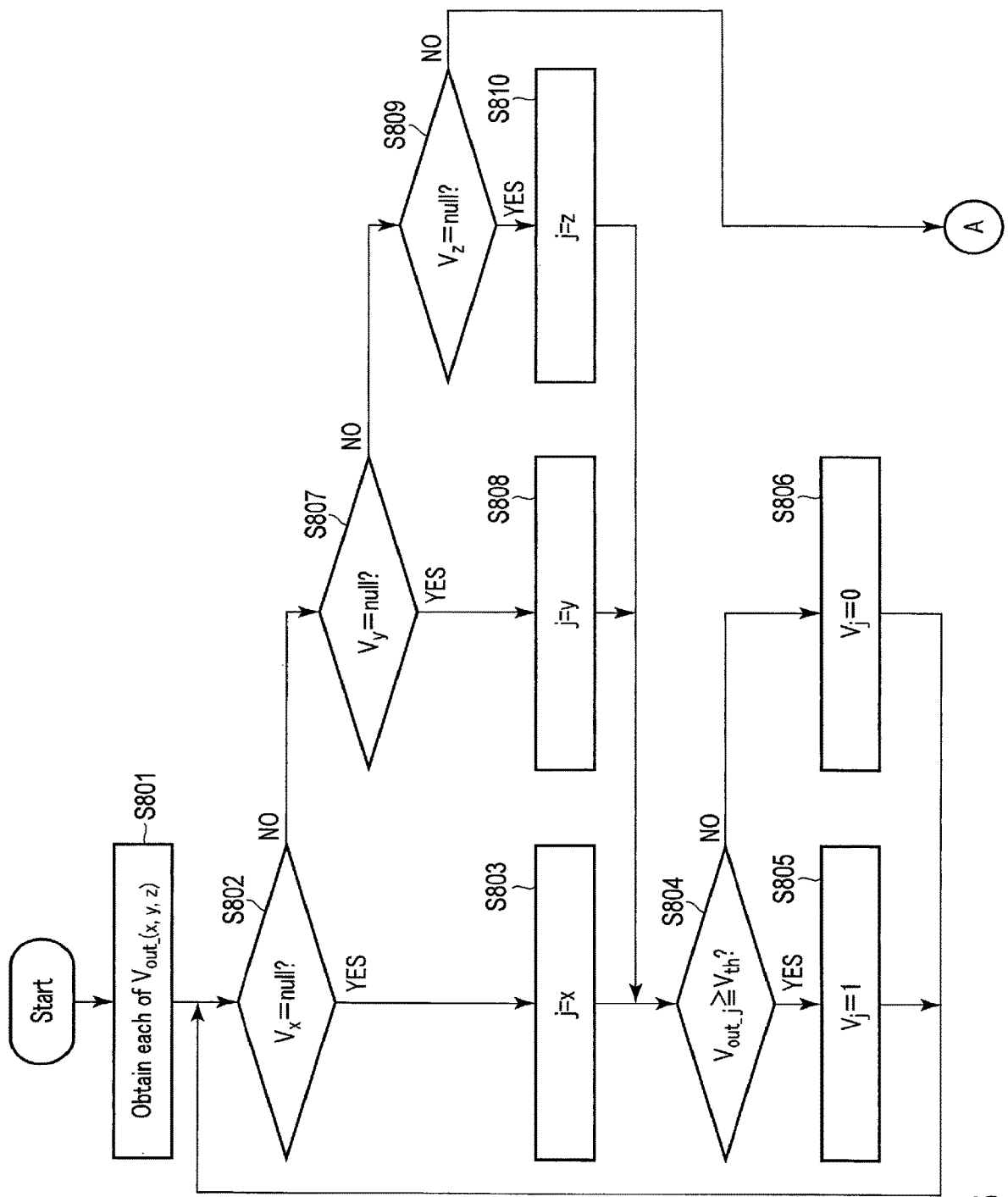
FIG. 8 is a flowchart of a process implemented by the power control circuitry according to the second embodiment.
Figure 9:
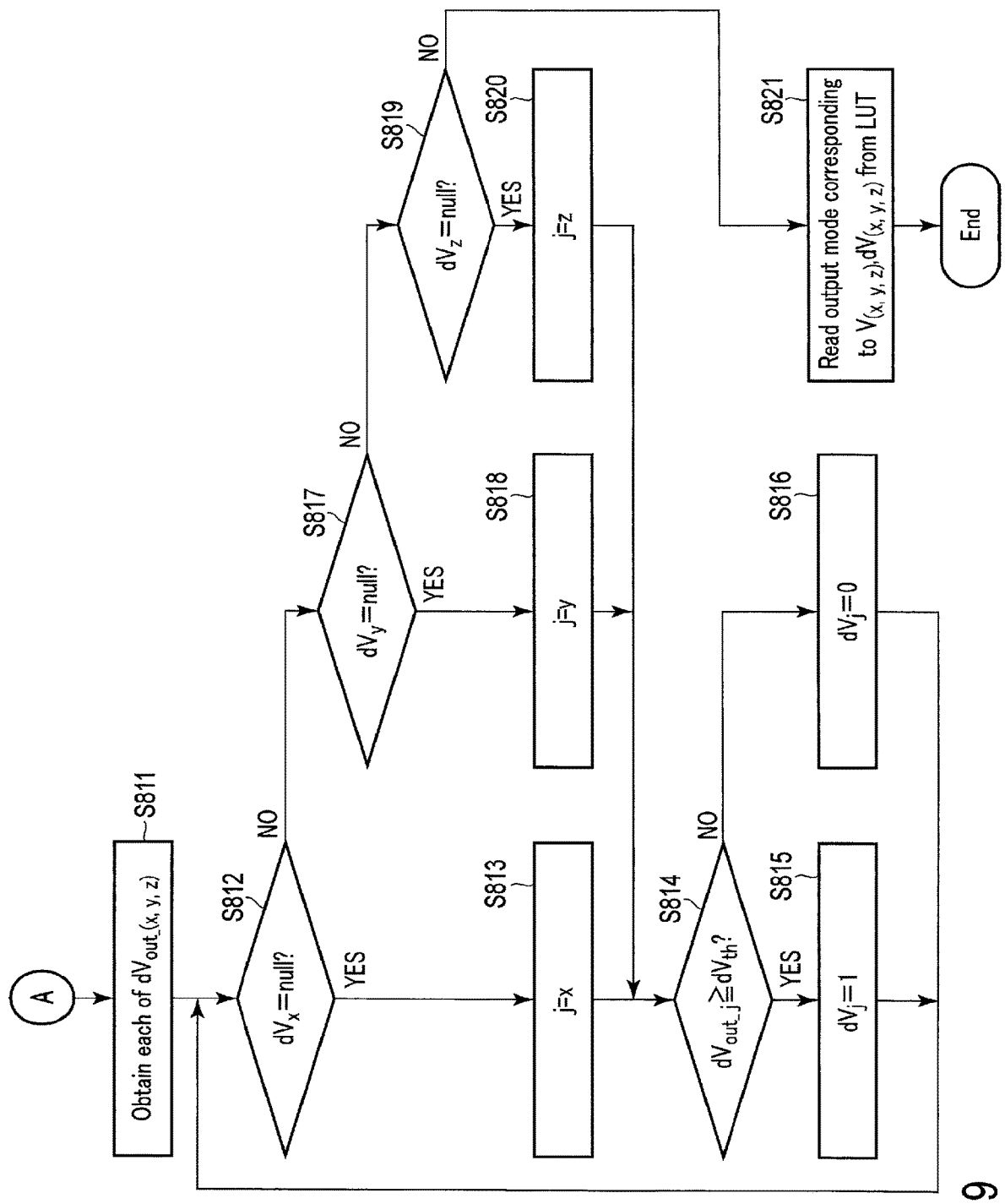
FIG. 9 is a flowchart of the process implemented by the power control circuitry according to the second embodiment.

FIGS. 8 and 9 are flowcharts of the process implemented by the power control circuitry according to the second embodiment. The process implemented by the current ratio control function of the power control circuitry 13' will be explained.

First, with the system control function 129a, the magnetic resonance imaging apparatus 100 reads the imaging protocol from the storage device 127 based on the imaging conditions input by the operator. The magnetic resonance imaging apparatus 100 transmits the imaging protocol to the imaging control circuitry 121, and thereby controls the imaging of the subject P. Here, the power control circuitry 13' of the gradient magnetic field power supply 105 starts the operation at step S801 at the timing of initiating the imaging of the subject P.

(Step S801)

The power control circuitry 13' obtains the value of the first voltage ($V_{out\_x}$) from the X-axis measurement device 12x, the value of the second voltage ($V_{out\_y}$) from the Y-axis measurement device 12y, and the value of the third voltage ($V_{out\_z}$) from the Z-axis measurement device 12z.

(Step S802)

The power control circuitry 13' determines whether or not a value is input to the first comparison result ($V_x$) ($V_x$=null?). If no value is input to the $V_x$, the process proceeds to step S803. If any value is input to the $V_x$, the process proceeds to step S807.

(Step S803)

The power control circuitry 13' substitutes x for the variable j, and the process proceeds to step S804. With this substitution, the power control circuitry 13' performs the operations, letting $V_{out\_j}=V_{out\_x}$ and $V_j=V_x$ during the subsequent steps S804 to S806.

(Step S804)

With the first voltage comparison function 710x, the power control circuitry 13' determines whether the first voltage ($V_{out\_x}$) is greater than or equal to the threshold voltage ($V_{th}$). If the first voltage is greater than or equal to the threshold voltage, the process proceeds to step S805. If the first voltage is smaller than the threshold voltage, the process proceeds to step S806.

When y is substituted for the variable j, the power control circuitry 13' determines, with the second voltage comparison function 710y, whether the second voltage ($V_{out\_y}$) is greater than or equal to the threshold voltage ($V_{th}$). The process proceeds to step S805 when the second voltage is greater than or equal to the threshold voltage. If the second voltage is smaller than the threshold voltage, the process proceeds to step S806.

When z is substituted for the variable j, the power control circuitry 13' determines, with the third voltage comparison function 710z, whether the third voltage ($V_{out\_z}$) is greater than or equal to the threshold voltage ($V_{th}$). If the third voltage is greater than or equal to the threshold voltage, the process proceeds to step S805. If the third voltage is smaller than the threshold voltage, the process proceeds to step S806.

(Step S805)

With the first voltage being greater than or equal to the threshold voltage, the power control circuitry 13' generates the first voltage comparison result ($V_x$) having a value of "1".

When y is substituted for the variable j, the power control circuitry 13' generates the second voltage comparison result ($V_y$) having a value of "1", with the second voltage being greater than or equal to the threshold voltage.

When z is substituted for the variable j, the power control circuitry 13' generates the third voltage comparison result ($V_z$) having a value of "1", with the third voltage being greater than or equal to the threshold voltage. After step S805, the process returns to step S802.

(Step S806)

With the first voltage being smaller than the threshold voltage, the power control circuitry 13' generates the first voltage comparison result ($V_x$) having a value of "0".

When y is substituted for the variable j, the power control circuitry 13' generates the second voltage comparison result ($V_y$) having a value of "0", with the second voltage being smaller than the threshold voltage.

When z is substituted for the variable j, the power control circuitry 13' generates the third voltage comparison result ($V_z$) having a value of "0", with the third voltage being smaller than the threshold voltage. After step S806, the process returns to step S802.

(Step S807)

The power control circuitry 13' determines whether or not any value is input to the second voltage comparison result ($V_y$) ($V_y$=null?). If no value is input to $V_y$, the process proceeds to step S808. If a value is input to $V_y$, the process proceeds to step S809.

(Step S808)

The power control circuitry 13' substitutes y for the variable j, and the process proceeds to step S804. With this substitution, the power control circuitry 13' performs the operations, letting $V_{out\_j}=V_{out\_y}$ and $V_j=V_y$ during the subsequent steps S804 to S806.

(Step S809)

The power control circuitry 13' determines whether or not any value is input to the third voltage comparison result ($V_z$) ($V_z$=null?). If no value is input to $V_z$, the process proceeds to step S810. If a value is input to $V_z$, the process proceeds to step S811.

(Step S810)

The power control circuitry 13' substitutes z for the variable j, and the process proceeds to step S804. With this substitution, the power control circuitry 13' performs the operations, letting $V_{out\_j}=V_{out\_z}$ and $V_j=V_z$ during the subsequent steps S804 to S806.

(Step S811)

The power control circuitry 13' obtains the first gradient value ($dV_{out\_x}$), the second gradient value ($dV_{out\_y}$) and the third gradient value ($dV_{out\_z}$).

(Step S812)

The power control circuitry 13' determines whether or not any value is input to the first gradient comparison result ($dV_x$) ($dV_x$=null?). If no value is input to the $dV_x$, the process proceeds to step S813. If a value is input to $dV_x$, the process proceeds to step S817.

(Step S813)

The power control circuitry 13' substitutes x for a variable j, and the process proceeds to step S814. With this substitution, the power control circuitry 13' performs the operations, letting $dV_{out\_j}=dV_{out\_x}$ and $dV_j=dV_x$ during the subsequent steps S814 to S816.

(Step S814)

With the first gradient comparison function 740x, the power control circuitry 13' determines whether the value of the first gradient value ($dV_{out\_x}$) is greater than or equal to the threshold gradient value ($dV_{th}$). If the first gradient value is greater than or equal to the threshold gradient value, the process proceeds to step S815. If the first gradient value is smaller than the threshold gradient value, the process proceeds to step S816.

When y is substituted for the variable j, the power control circuitry 13' determines, with the second gradient comparison function 740y, whether the second gradient value ($dV_{out\_y}$) is greater than or equal to the threshold gradient value ($dV_t$h). If the second gradient value is greater than or equal to the threshold gradient value, the process proceeds to step S815. If the second gradient value is smaller than the threshold gradient value, the process proceeds to step S816.

When z is substituted for the variable j, the power control circuitry 13' determines, with the third gradient comparison function 740z, whether the third gradient value ($dV_{out\_z}$) is greater than or equal to the threshold gradient value ($dV_{th}$). If the third gradient value is greater than or equal to the threshold gradient value, the process proceeds to step S815. If the third gradient value is smaller than the threshold gradient value, the process proceeds to step S816.

(Step S815)

With the first gradient value being greater than or equal to the threshold gradient value, the power control circuitry 13' generates the first gradient comparison result ($dV_x$) having a value of "1".

When y is substituted for the variable j, with the second gradient value being greater than or equal to the threshold gradient value, the power control circuitry 13' generates the second gradient comparison result ($dV_y$) having a value of "1".

When z is substituted for the variable j, with the third gradient value being greater than or equal to the threshold gradient value, the power control circuitry 13' generates the third gradient comparison result ($dV_z$) having a value of "1". After step S815, the process returns to step S812.

(Step S816)

With the first gradient value being smaller than the threshold gradient value, the power control circuitry 13' generates the first gradient comparison result ($dV_x$) having a value of "0".

When y is substituted for the variable j, with the second gradient value being smaller than the threshold gradient value, the power control circuitry 13' generates the second gradient comparison result ($dV_y$) having a value of "0".

When z is substituted for the variable j, with the third gradient value being smaller than the threshold gradient value, the power control circuitry 13' generates the third gradient comparison result ($dV_z$) having a value of "0". After step S816, the process returns to step S812.

(Step S817)

The power control circuitry 13' determines whether or not any value is input to the second gradient comparison result ($dV_y$) ($dV_y$=null?) If no value is input to $dV_y$, the process proceeds to step S818. If a value is input to $dV_y$, the process proceeds to step S819.

(Step S818)

The power control circuitry 13' substitutes y for the variable j, and the process proceeds to step S814. With this substitution, the power control circuitry 13' performs the operations, letting $dV_{out\_j} = dV_{out\_y}$ and $dV_j = dV_y$ during the subsequent steps S814 to S816.

(Step S819)

The power control circuitry 13' determines whether or not any value is input to the third gradient comparison result ($dV_z$) ($dV_z$=null?). If no value is input to $dV_z$, the process proceeds to step S820. If a value is input to $dV_z$, the process proceeds to step S821.

(Step S820)

The power control circuitry 13' substitutes z for the variable j, and the process proceeds to step S814. With this substitution, the power control circuitry 13' performs the operations, letting $dV_{out\_j} = dV_{out\_z}$ and $dV_j = dV_z$ during the subsequent steps S814 to S816.

(Step S821)

With the determination function 750, the power control circuitry 13' reads from the LUT the output mode ($I_{limit\_x}$, $I_{limit\_y}$, $I_{limit\_z}$) corresponding to the first combination of the first voltage comparison result ($V_x$), the second voltage comparison result ($V_y$), the third voltage comparison result ($V_z$), the first gradient comparison result ($dV_x$), the second gradient comparison result ($dV_y$), and the third gradient comparison result ($dV_z$).

After step S821, the values of the first voltage comparison result ($V_x$), the second voltage comparison result ($V_y$), the third voltage comparison result ($V_z$), the first gradient comparison result ($dV_x$), the second gradient comparison result ($dV_y$), and the third gradient comparison result ($dV_z$) are reset, and the process is terminated. When the value of the first voltage comparison result is reset, "$V_x$=null". When the value of the second voltage comparison result is reset, "$V_y$=null", and when the value of the third voltage comparison result is reset, "$V_z$=null". Furthermore, when the value of the first gradient comparison result is reset, "$dV_x$=null"; when the value of the second gradient comparison result is reset, "$dV_y$=null"; and when the value of the third gradient comparison result is reset, "$dV_z$=null". The operations are repeated until all of the X-axis capacitor bank 21x, the Y-axis capacitor bank 21y, and the Z-axis capacitor bank 21z are brought into the charging completed mode.

The operations from steps S802 to S820 may be performed in parallel. The operation of step S821 is performed with the determination function 750 at the timing of all of the first voltage comparison result ($V_x$), the second voltage comparison result ($V_y$), the third voltage comparison result ($V_z$), the first gradient comparison result ($dV_x$), the second gradient comparison result ($dV_y$), and the third gradient comparison result ($dV_z$) having been determined to form the first combination.

FIG. 10 is a diagram of the LUT according to the second embodiment. In an LUT 1000 according to the second embodiment, the first combination of the $V_x$, $V_y$, $V_z$, $dV_x$, $dV_y$, and $dV_z$ is associated with the second combination of $I_{limit\_x}$, $I_{limit\_y}$, and $I_{limit\_z}$, as illustrated in FIG. 10. The first combination denotes a combination of the six output values (signals corresponding to the respective truth values) generated in accordance with the first voltage comparison function 710x, the second voltage comparison function 710y, the third voltage comparison function 710z, the first gradient comparison function 740x, the second gradient comparison function 740y, and the third gradient comparison function 740z. The second combination includes the first ratio of the first current, the second ratio of the second current, and the third ratio of the third current in integral percentage (%), relative to the sum (total current amount) of the first current, the second current, and the third current that are output from the power supplier 11.

A combination 1001 of ($V_x$, $V_y$, $V_z$, $dV_x$, $dV_y$, $dV_z$)=(1, 1, 1, 0, 0, 0) represents all of the X-axis capacitor bank 21x, the Y-axis capacitor bank 21y, and the Z-axis capacitor bank 21z being in the charging completed mode. A combination 1002 of ($I_{limit\_x}$, $I_{limit\_y}$, $I_{limit\_z}$)=(33, 33, 33), which corresponds to the combination 1001, represents approximately the same amount of current assigned to the X-axis capacitor bank 21x, the Y-axis capacitor bank 21y, and the Z-axis capacitor bank 21z.

A combination 1003 of ($V_x$, $V_y$, $V_z$, $dV_x$, $dV_y$, $dV_z$)=(1, 1, 0, 0, 0, 0) represents the X-axis capacitor bank 21x and the Y-axis capacitor bank 21y being in the charging completed mode, and the Z-axis capacitor bank 21z being in the charging required mode. A combination 1004 of ($I_{limit\_x}$, $I_{limit\_y}$, $I_{limit\_z}$)=(4, 4, 92), which corresponds to the combination 1003, represents the amount of current assigned to the Z-axis capacitor bank 21z on a priority basis.

A combination 1005 of ($V_x$, $V_y$, $V_z$, $dV_x$, $dV_y$, $dV_z$)=(1, 1, 0, 0, 0, 1) represents the X-axis capacitor bank 21x and the Y-axis capacitor bank 21y being in the charging completed mode, and the Z-axis capacitor bank 21z being in the charging required mode and discharging mode. A combination 1006 of ($I_{limit\_x}$, $I_{limit\_y}$, $I_{limit\_z}$)=(4, 4, 92), which corresponds to the combination 1005, represents the amount of current assigned to the Z-axis capacitor bank 21z on a priority basis.

A combination 1007 of ($V_x$, $V_y$, $V_z$, $dV_x$, $dV_y$, $dV_z$)=(1, 0, 0, 0, 0, 0) represents the X-axis capacitor bank 21x being in the charging completed mode, and the Y-axis capacitor bank 21y and the Z-axis capacitor bank 21z being in the charging required mode. A combination 1008 of ($I_{limit\_x}$, $I_{limit\_y}$, $I_{limit\_z}$)=(4, 48, 48), which corresponds to the combination 1007, represents the amounts of current assigned to the Y-axis capacitor bank 21y and the Z-axis capacitor bank 21z on a priority basis.

A combination 1009 of ($V_x$, $V_y$, $V_z$, $dV_x$, $dV_y$, $dV_z$)=(1, 0, 0, 0, 0, 1) represents the X-axis capacitor bank 21x being in the charging completed mode, the Y-axis capacitor bank 21y being in the charging required mode, and the Z-axis capacitor bank 21z being in the charging required mode and the discharging mode. A combination 1010 of ($I_{limit\_x}$, $I_{limit\_y}$, $I_{limit\_z}$)=(4, 4, 92), which corresponds to the combination 1009, represents the amount of current assigned to the Z-axis capacitor bank 21z on a priority basis.

A combination 1011 of ($V_x$, $V_y$, $V_z$, $dV_x$, $dV_y$, $dV_z$)=(0, 0, 0, 0, 0, 0) represents all of the X-axis capacitor bank 21x, the Y-axis capacitor bank 21y, and the Z-axis capacitor bank 21z being in the charging required mode. A combination 1012 of ($I_{limit\_x}$, $I_{limit\_y}$, $I_{limit\_z}$)=(33, 33, 33), which corresponds to the combination 1011, represents approximately the same amount of current assigned to the X-axis capacitor bank 21x, the Y-axis capacitor bank 21y, and the Z-axis capacitor bank 21z.

A combination 1013 of ($V_x$, $V_y$, $V_z$, $dV_x$, $dV_y$, $dV_z$)=(0, 0, 0, 0, 0, 1) represents all of the X-axis capacitor bank 21x, the Y-axis capacitor bank 21y, and the Z-axis capacitor bank 21z being in the charging required mode, and the Z-axis capacitor bank 21z being in the discharging mode. A combination 1014 of ($I_{limit\_x}$, $I_{limit\_y}$, $I_{limit\_z}$)=(4, 4, 92), which corresponds to the combination 1013, represents the amount of current assigned to the Z-axis capacitor bank 21z on a priority basis.

In the operation for the above combination 1013, a conventional magnetic resonance imaging apparatus would equally charge all of the capacitor banks. The magnetic resonance imaging apparatus 100 according to the present embodiment, however, charges a channel having a voltage that is being lowered (Z-axis capacitor bank 21z) on a priority basis, and therefore the voltage of the channel can be prevented from being lowered.

A combination 1015 of ($V_x$, $V_y$, $V_z$, $dV_x$, $dV_y$, $dV_z$)=(0, 0, 0, 0, 1, 1) represents all of the X-axis capacitor bank 21x, the Y-axis capacitor bank 21y, and the Z-axis capacitor bank 21z being in the charging required mode, and the Y-axis capacitor bank 21y and the Z-axis capacitor bank 21z being in the discharging mode. A combination 1016 of ($I_{limit\_x}$, $I_{limit\_y}$, $I_{limit\_z}$)=(4, 48, 48), which corresponds to the combination 1015, represents the amount of current assigned to the Y-axis capacitor bank 21y and the Z-axis capacitor bank 21z on a priority basis.

A combination 1017 of ($V_x$, $V_y$, $V_z$, $dV_x$, $dV_y$, $dV_z$)=(0, 0, 0, 1, 1, 1) represents all of the X-axis capacitor bank 21x, the Y-axis capacitor bank 21y, and the Z-axis capacitor bank 21z being in the charging required mode and the discharging mode. A combination 1018 of ($I_{limit\_x}$, $I_{limit\_y}$, $I_{limit\_z}$)=(33, 33, 33), which corresponds to the combination 1017, represents approximately the same amount of current assigned to the X-axis capacitor bank 21x, the Y-axis capacitor bank 21y, and the Z-axis capacitor bank 21z.

Figure 11:
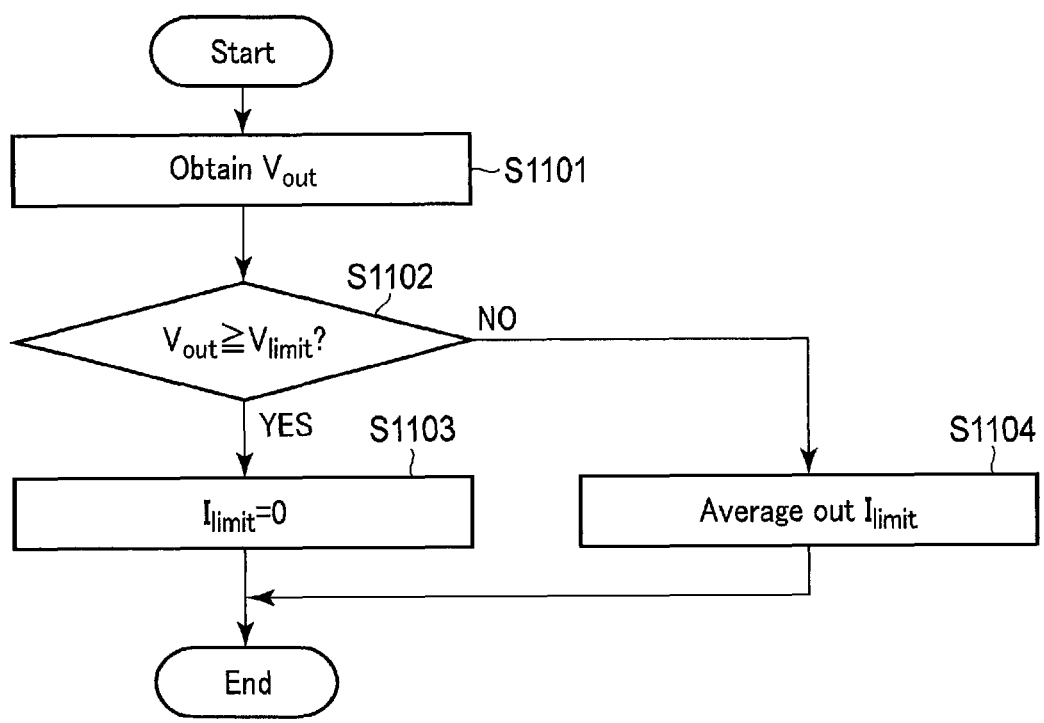
FIG. 11 is a flowchart of the process implemented by the power control circuitry according to the second embodiment.

FIG. 11 is a flowchart of the process implemented by the power control circuitry according to the second embodiment. The process implemented by the current setting function of the power control circuitry 13' will be explained. For the sake of simplicity, the process in relation to the X-axis gradient coil 103x will be explained, and the processes in relation to the Y-axis gradient coil 103y and the Z-axis gradient coil 103z will be omitted.

(Step S1101)

The power control circuitry 13' obtains the output voltage ($V_{out}$) from the measurement device 12. In particular, the power control circuitry 13' obtains the first voltage ($V_{out\_x}$) from the X-axis measurement device 12x.

(Step S1102)

The power control circuitry 13' determines whether the output voltage is greater than or equal to the upper limit voltage ($V_{limit}$). In particular, with the fourth voltage comparison function 761x, the power control circuitry 13' determines whether the first voltage is greater than or equal to the upper limit voltage. If the output voltage (or the first voltage) is greater than or equal to the upper limit voltage, the process proceeds to step S1103. If the output voltage (or the first voltage) is smaller than the upper limit voltage, the process proceeds to step S1104.

(Step S1103)

With the output voltage being greater than or equal to the upper limit voltage, the power control circuitry 13' sets the target current ($I_{limit}$) to zero. In particular, with the output voltage being greater than or equal to the upper limit voltage, the power control circuitry 13' selects the current value of zero (I=0), and sets the first target current to zero, with a first signal selection function.

(Step S1104)

With the output voltage being smaller than the upper limit voltage, the power control circuitry 13' sets the averaged target current. In particular, with the output voltage being smaller than the upper limit voltage, the power control circuitry 13' selects the averaged first target current, with the first signal selection function. After step S1104, the process is terminated. The above operations are repeated until all of the X-axis capacitor bank 21x, the Y-axis capacitor bank 21y, and the Z-axis capacitor bank 21z are brought into the charging completed mode.

Examples of the current ratio control according to the second embodiment will be explained with reference to FIGS. 12, 13, and 14.

FIG. 12 is a diagram illustrating waveforms of the currents that are output from the amplifiers according to the second embodiment. A current waveform 1200x indicates the value of the current output from the X-axis amplifier 22x. A current waveform 1200y indicates the value of the current output from the Y-axis amplifier 22y. A current waveform 1200z indicates the value of the current output from the Z-axis amplifier 22z.

For instance, a current that generates a gradient magnetic field for probing water molecular diffusion (Motion Probing Gradient, or MPG) is supplied from the Y-axis amplifier 22y to the Y-axis gradient coil 103y over the time period between time $t_1$ and time $t_2$, in response to which the Y-axis gradient coil 103y generates a gradient magnetic field corresponding to the MPG.

Thereafter, the current required for the echo planer imaging (EPI) is supplied from the X-axis amplifier 22x to the X-axis gradient coil 103x over the time period between time $t_2$ and time $t_3$, in response to which the X-axis gradient coil 103x generates a gradient magnetic field corresponding to the EPI. This means that the power supplier 11 supplies the current to the X-axis amplifier 22x after supplying the current to the Y-axis amplifier 22y.

FIG. 13 is a diagram illustrating the waveforms of the currents that are output from the power supplier and the target waveforms according to the second embodiment. A current waveform 1300x indicates the current ratio of the current that is output from the power supplier 11 to the X-axis capacitor bank 21x. A target current waveform 1301x indicates the current ratio in relation to the first target current. A current waveform 1300y indicates the current ratio of the current that is output from the power supplier 11 to the Y-axis capacitor bank 21y. The target current waveform 1301y indicates the current ratio in relation to the second target current. The current waveform 1300z indicates the current ratio of the current that is output from the power supplier 11 to the Z-axis capacitor bank 21z. The total current waveform 1302 indicates the summed value of the current waveform 1300x, the current waveform 1300y, and the current waveform 1300z.

FIG. 14 is a diagram illustrating the waveforms of the voltages that are output from the power supplier according to the second embodiment. The voltage waveform 1400x relates to the current waveform 1300x, and indicates the ratio of the first voltage to the voltage of the charging completed mode in the X-axis capacitor bank 21x. The voltage waveform 1400y relates to the current waveform 1300y, and indicates the ratio of the second voltage to the voltage of the charging completed mode in the Y-axis capacitor bank 21y. The voltage waveform 1400z relates to the current waveform 1300z, and indicates the ratio of the third voltage to the voltage of the charging completed mode in the Z-axis capacitor bank 21z.

Only the Y-axis gradient coil 103y is used during the time period between time $t_1$ and time $t_2$, and therefore the target current waveform 1301y indicates 92%. Thereafter, only the X-axis gradient coil 103x is used during the time period between time $t_2$ and time $t_3$, and therefore the target current waveform 1301x indicates 92%.

In the conventional technique, when the voltage waveform 1400y falls short of 100% at time $t_2$, the same amount of current as to the X-axis gradient coil 103x is supplied after time $t_2$ to the Y-axis gradient coil 103y that is not used for the imaging. In contrast, according to the present embodiment, the voltage values are monitored so that the current can be suitably supplied to a gradient coil that is used for the imaging.

At time $t_4$ when the voltage waveform 1400y reaches 100%, the Y-axis amplifier 22y needs the supply of an idling current only. The target current waveform 1301x is therefore set back to 92%. Thereafter, at time is when the voltage waveform 1400x reaches 100%, the X-axis amplifier 22x also needs the supply of an idling current only.

As discussed above, the magnetic resonance imaging apparatus 100 according to the second embodiment is provided with a plurality of gradient coils configured to receive power supply and to generate gradient magnetic fields having different axes, and a gradient magnetic field power supply configured to supply power. The gradient magnetic field power supply is provided with a plurality of amplifiers respectively coupled to the gradient coils, a power supplier that supplies a current to the amplifiers, a measurement device that measures the voltages applied to the amplifiers, and a power control circuitry that controls the current supplied from the power supplier to the amplifiers based on the voltages. The power control circuitry is provided with a voltage comparator that compares the voltages applied to the amplifiers with a threshold voltage, a voltage gradient comparator that compares the temporal change of the voltage applied to an amplifier with a threshold gradient indicative of a gradient per unit of time, and a determination unit that determines the ratio of the current supplied to each of the amplifiers corresponding to a plurality of gradient coils to the sum of the current supplied to these amplifiers, in accordance with the comparison results obtained by the voltage comparator and the voltage gradient comparator. With this structure, the magnetic resonance imaging apparatus 100 efficiently controls the assignment of the output current from the power supplier.

The magnetic resonance imaging apparatus 100 according to the present embodiment is provided with an X-axis gradient coil, a Y-axis gradient coil, a Z-axis gradient coil, and a gradient magnetic field power supply. The gradient magnetic field power supply includes a power supplier, a measurement device, and a power control circuitry. The power supplier supplies the first current, the second current, and the third current respectively to the three amplifiers coupled to the X-axis gradient coil, the Y-axis gradient coil, and the Z-axis gradient coil. The measurement device measures the first voltage corresponding to the first current, the second voltage corresponding to the second current, and the third voltage corresponding to the third current. The power control circuitry uses the first voltage, the second voltage, and the third voltage to control the first current, the second current, and the third current. The power control circuitry is provided with a first comparator, a second comparator, a third comparator, a fourth comparator, a fifth comparator, a sixth comparator, a memory, and a determination unit. The first comparator compares the first voltage with the threshold voltage and thereby generates the first voltage comparison result. The second comparator compares the second voltage with the threshold voltage and thereby generates the second voltage comparison result. The third comparator compares the third voltage with the threshold voltage and thereby generates the third voltage comparison result. The fourth comparator compares the value indicating the temporal change of the first voltage with the threshold gradient value indicating the gradient per unit of time, and thereby generates the first gradient comparison result. The fifth comparator compares the value indicating the temporal change of the second voltage with the threshold gradient value, and thereby generates the second gradient comparison result. The sixth comparator compares the value indicating the temporal change of the third voltage with the threshold gradient value, and thereby generates the third gradient comparison result. The memory stores therein a look-up table that associates the first combination of six comparison results generated by the first comparator, the second comparator, the third comparator, the fourth comparator, the fifth comparator, and the sixth comparator, with the second combination of the first ratio of the first current, the second ratio of the second current, the third ratio of the third current, with respect to the sum of the first current, the second current, and the third current. The determination unit determines the second combination based on the combination of the first voltage comparison result, the second voltage comparison result, the third voltage comparison result, the first gradient comparison result, the second gradient comparison result, and the third gradient comparison result, and also based on the look-up table. The power control circuitry controls the power supplier, using the determined second combination. With this structure, the magnetic resonance imaging apparatus 100 efficiently controls the assignment of the output current from the power supplier.

In the magnetic resonance imaging apparatus 100, the power control circuitry may be further provided with a feedback controller that performs the feedback control onto the first current, the second current, and the third current, using the determined second combination. The power control circuitry controls the power supplier, using the first current, the second current, and the third current, onto which the feedback control is performed. With this structure, the magnetic resonance imaging apparatus 100 efficiently controls the assignment of the output current from the power supplier.

In the magnetic resonance imaging apparatus 100, the power control circuitry may be further provided with a current setting unit that sets the first target current in accordance with the first ratio if the first voltage is smaller than the upper limit voltage, which is higher than the threshold voltage; sets the first target current to zero if the first voltage is greater than or equal to the upper limit voltage; sets the second target current in accordance with the second ratio if the second voltage is smaller than the upper limit voltage; sets the second target current to zero if the second voltage is greater than or equal to the upper limit voltage; sets the third target current in accordance with the third ratio if the third voltage is smaller than the upper limit voltage; and sets the third target current to zero if the third voltage is greater than or equal to the upper limit voltage; and a feedback controller that performs feedback control onto the first current, the second current, and the third current using the first target current, the second target current, and the third target current. The power control circuitry controls the power supplier using the first current, the second current, and the third current onto which the feedback control has been performed. With this structure, the magnetic resonance imaging apparatus 100 efficiently controls the assignment of the output current from the power supplier.

The magnetic resonance imaging apparatus 100 according to the present embodiment is provided with a plurality of amplifiers that supply power to the gradient coils having a plurality of channels. The magnetic resonance imaging apparatus 100 is provided with an acquisition unit that acquires a voltage gradient that represents the temporal change of the voltage of the power supply that supplies the current to the amplifier for each channel, and a power supplier that supplies power to an amplifier corresponding to a specific one of the channels on a priority basis in accordance with the voltage gradient. With this structure, the magnetic resonance imaging apparatus 100 efficiently controls the assignment of the output power from the power supplier.

In the magnetic resonance imaging apparatus 100, the acquisition unit acquires the temporal change in the voltage drop of a capacitor arranged upstream of the amplifier, as a voltage gradient.

In the magnetic resonance imaging apparatus 100, the power supplier can supply power, on a priority basis, to a channel having a larger temporal change of the voltage drop in the capacitor than other channels.

The magnetic resonance imaging apparatus 100 according to the above embodiments performs software control for controlling the current from the gradient magnetic field power supply to the gradient coils. As a result, the magnetic resonance imaging apparatus 100 having a conventional hardware structure can improve the performance of the gradient magnetic field power supply. Specifically, the magnetic resonance imaging apparatus 100 may improve a b-value with respect to a specific echo time. That is, the magnetic resonance imaging apparatus 100 reduces the echo time until it reaches a specific b-value. The magnetic resonance imaging apparatus 100 avoids the increase of the costs and size which tends to occur if the hardware structure is to be changed.

According to at least one of the above embodiments, the assignment of the output current from the power supplier can be efficiently controlled.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

The invention claimed is:

1. A magnetic resonance imaging apparatus, comprising:
   amplifiers configured to supply power for each of a plurality of channels of gradient coils;
   processing circuitry configured to obtain, for each of the channels, a voltage gradient that represents a temporal change of a power supply voltage for supplying a current to the amplifiers; and
   a power supplier configured to supply the power to an amplifier corresponding to a specific one of the channels on a priority basis in accordance with the voltage gradient.

2. A magnetic resonance imaging apparatus, comprising:
   an X-axis gradient coil;
   a Y-axis gradient coil;
   a Z-axis gradient coil;
   a power supplier configured to supply a first current, a second current, and a third current supply respectively to three amplifiers that are coupled to the X-axis gradient coil, the Y-axis gradient coil, and the Z-axis gradient coil;
   a measurement device configured to measure a first voltage corresponding to the first current, a second voltage corresponding to the second current, and a third voltage corresponding to the third current;
   processing circuitry configured to:
     generate a first voltage comparison result by comparing the first voltage with a threshold voltage,
     generate a second voltage comparison result by comparing the second voltage with the threshold voltage,
     generate a third voltage comparison result by comparing the third voltage with the threshold voltage,
     generate a first gradient comparison result by comparing a value representing a temporal change of the first voltage with a threshold gradient value representing a gradient per unit of time,
     generate a second gradient comparison result by comparing a value representing a temporal change of the second voltage with the threshold gradient value, and
     generate a third gradient comparison result by comparing a value representing a temporal change of the third voltage with the threshold gradient value; and
   a memory configured to store a look-up table that associates first combinations of the six comparison results with second combinations of a first ratio, a second ratio, and a third ratio, wherein the first ratio represents a ratio of the first current to a sum of the first current, the second current, and the third current, the second ratio represents a ratio of the second current to the sum, and the third ratio represents a ratio of the third current to the sum,
   wherein the processing circuitry is further configured to:
     determine a second combination based on the look-up table and a first combination of the first voltage comparison result, the second voltage comparison result, the third voltage comparison result, the first gradient comparison result, the second gradient comparison result, and the third gradient comparison result that have been generated, and
     control the power supplier by using the determined second combination.

3. The magnetic resonance imaging apparatus according to claim 2, wherein the processing circuitry is further configured to:
  perform feedback control onto the first current, the second current, and the third current, using the determined second combination; and
  control the power supplier, using the first current, the second current, and the third current onto which the feedback control has been performed.

4. The magnetic resonance imaging apparatus according to claim 2, wherein
the processing circuitry is further configured to:
  set a first target current in accordance with the first ratio when the first voltage is smaller than an upper limit voltage that is higher than the threshold voltage, and set the first target current to zero when the first voltage is greater than or equal to the upper limit voltage,
  set a second target current in accordance with the second ratio when the second voltage is smaller than the upper limit voltage, and set the second target current to zero when the second voltage is greater than or equal to the upper limit voltage,
  set a third target current in accordance with the third ratio when the third voltage is smaller than the upper limit voltage, and set the third target current to zero when the third voltage is greater than or equal to the upper limit voltage,
  perform feedback control onto the first current, the second current, and the third current, using the first target current, the second target current, and the third target current, and
  control the power supplier by using the first current, the second current, and the third current onto which the feedback control is performed.

5. A magnetic resonance imaging apparatus, comprising:
amplifiers configured to supply power for each of a plurality of channels of gradient coils;
processing circuitry configured to obtain, for each of the channels, a voltage gradient that represents a temporal change of a power supply voltage for supplying a current to the amplifiers; and
a power supplier configured to supply the power to an amplifier corresponding to a specific one of the channels on a priority basis in accordance with the voltage gradient, wherein
the processing circuitry is further configured to obtain, as the voltage gradient, a temporal change of a voltage drop of a capacitor arranged upstream of the amplifier.

6. The magnetic resonance imaging apparatus according to claim 5, wherein
the power supplier supplies the power, on the priority basis, to a channel having a temporal change of the voltage drop of the capacitor that is larger than temporal changes in other channels.

7. A magnetic resonance imaging apparatus, comprising:
amplifiers configured to supply power for each of a plurality of channels of gradient coils;
processing circuitry configured to obtain, for each of the channels, a voltage gradient that represents a temporal change of a power supply voltage for supplying a current to the amplifiers; and
a power supplier configured to supply the power to an amplifier corresponding to a specific one of the channels on a priority basis in accordance with the voltage gradient, wherein
the processing circuitry is further configured to:
  generate a first comparison result by comparing a voltage applied to the amplifier with a threshold voltage,
  generate a second comparison result by comparing the voltage gradient with a threshold gradient value that represents a gradient per unit of time, and
  determine a ratio of current supplied to each of the amplifiers relative to a sum of current supplied to the amplifiers in accordance with the first comparison result and the second comparison result.

* * * * *